United States Patent
Suzuki et al.

(10) Patent No.: US 10,423,128 B2
(45) Date of Patent: Sep. 24, 2019

(54) WORKING APPARATUS FOR COMPONENT OR BOARD AND COMPONENT MOUNTING APPARATUS

(71) Applicant: YAMAHA HATSUDOKI KABUSHIKI KAISHA, Shizuoka-ken (JP)

(72) Inventors: Yasuhiro Suzuki, Shizuoka-ken (JP); Yasunori Naitoh, Shizuoka-ken (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 869 days.

(21) Appl. No.: 13/829,001

(22) Filed: Mar. 14, 2013

(65) Prior Publication Data

US 2013/0304249 A1 Nov. 14, 2013

(30) Foreign Application Priority Data

May 14, 2012 (JP) .................................. 2012-110520

(51) Int. Cl.
*G05B 13/02* (2006.01)
*H05K 13/04* (2006.01)
(Continued)

(52) U.S. Cl.
CPC ............ *G05B 13/021* (2013.01); *B25J 9/16* (2013.01); *H05K 13/041* (2018.08); *H05K 13/089* (2018.08); *H05K 13/0812* (2018.08)

(58) Field of Classification Search
CPC .......... H04K 13/0404; H04K 13/0408; H04K 13/0413; G05B 19/404; G05B 13/021; B25J 9/16; H05K 13/08
(Continued)

(56) References Cited

U.S. PATENT DOCUMENTS 6,563,530 B1 * 5/2003 Oyama et al. ................... 348/87
8,339,445 B2 * 12/2012 Yoro et al. ....................... 348/77
(Continued)

FOREIGN PATENT DOCUMENTS

DE 10224993 C1 8/2003
EP 1671525 A1 6/2006
(Continued)

OTHER PUBLICATIONS

The extended European search report dated Jan. 30, 2014, which corresponds to European Patent Application No. 13001803.9-1803 and is related to U.S. Appl. No. 13/829,001.

*Primary Examiner* — Kenneth M Lo
*Assistant Examiner* — Michael J Huntley
(74) *Attorney, Agent, or Firm* — Studebaker & Brackett PC

(57) ABSTRACT

This working apparatus for a component or a board includes a head unit and a control portion. The control portion performs control of calculating a rotation angle in a horizontal plane of the head unit from displacement of the center of a first imaging portion and displacement of the center of a second imaging portion and correcting the center position of a working mechanism portion on the basis of the amount of rotation-induced displacement of the center of the working mechanism portion due to the rotation angle, a first amount of displacement in a first direction in the horizontal plane being not induced by rotation of the center of the working mechanism portion, and a second amount of displacement in a second direction in the horizontal plane being not induced by the rotation of the center of the working mechanism portion when moving the head unit.

16 Claims, 7 Drawing Sheets

(51) Int. Cl.
*H05K 13/08* (2006.01)
*B25J 9/16* (2006.01)
(58) Field of Classification Search
USPC .................................................. 700/193, 213
See application file for complete search history.

(56) References Cited

U.S. PATENT DOCUMENTS

| | | | |
|---|---|---|---|
| 2002/0031279 A1* | 3/2002 | Shimizu | 382/291 |
| 2006/0048380 A1* | 3/2006 | Okuda et al. | 29/832 |
| 2007/0145102 A1* | 6/2007 | Blessing et al. | 228/101 |
| 2008/0250636 A1* | 10/2008 | Okuda et al. | 29/834 |
| 2009/0000110 A1* | 1/2009 | Maenishi | 29/743 |
| 2009/0252400 A1 | 10/2009 | Iwase | |
| 2010/0171824 A1* | 7/2010 | Utsumi | 348/95 |
| 2013/0107033 A1* | 5/2013 | Kido | 348/86 |
| 2013/0298391 A1* | 11/2013 | Suzuki et al. | 29/705 |
| 2013/0304249 A1* | 11/2013 | Suzuki et al. | 700/193 |

FOREIGN PATENT DOCUMENTS

| | | | | |
|---|---|---|---|---|
| JP | 3697948 B2 | 7/2005 | | |
| JP | 2000-353899 A | 9/2005 | | |
| JP | 2005-347555 A | 12/2005 | | |
| JP | 2008-010554 A | 1/2008 | | |
| JP | 4416899 B2 | 12/2009 | | |
| JP | 2001-244696 A | 2/2010 | | |
| JP | WO 2012026101 A1 * | 3/2012 | ............. | H04N 7/18 |
| WO | 2005120147 A1 | 12/2005 | | |

* cited by examiner (FIRST EMBODIMENT, THIRD EMBODIMENT
HEAD UNIT DURING MOVEMENT IN DIRECTION

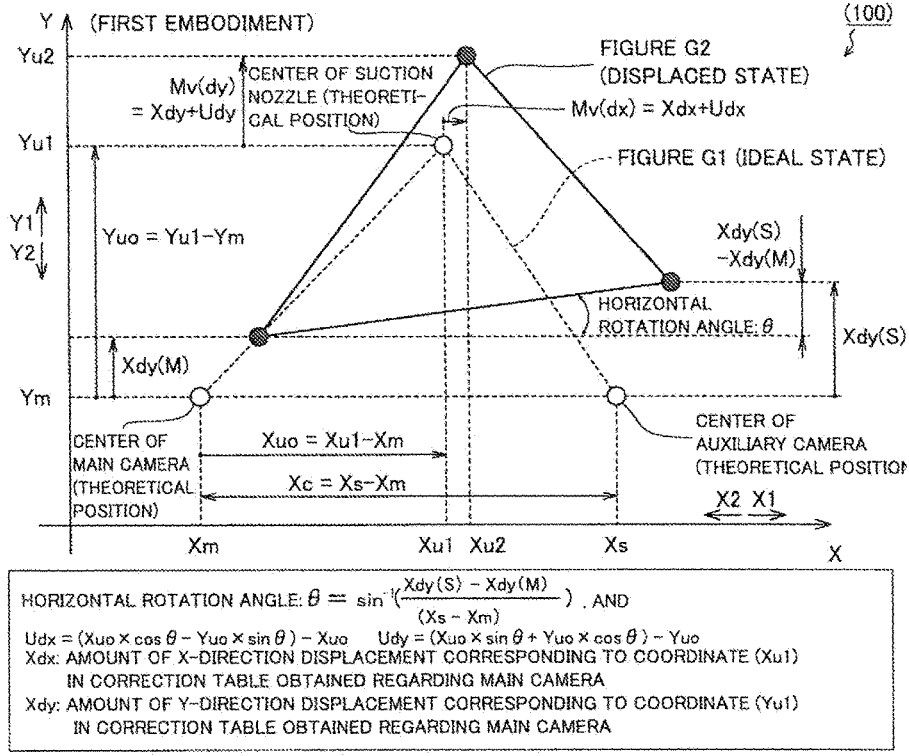
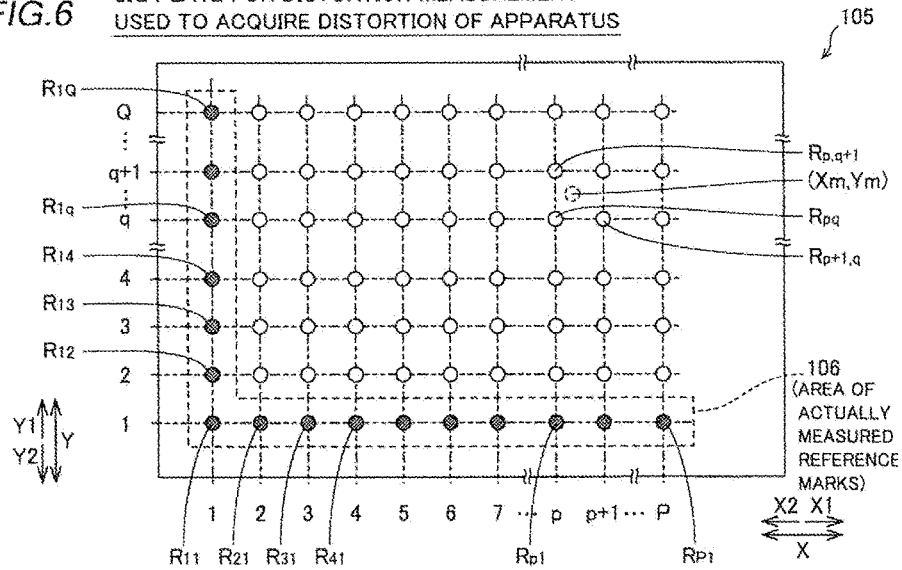

*FIG.7*

CORRECTION TABLE IN WHICH CORRECTION AMOUNTS (AMOUNTS OF DISPLACEMENT) WITH RESPECT TO THEORETICAL COORDINATES ACQUIRED WITH MAIN CAMERA ARE STORED

5a

| ROW (X-COORDINATE) | 1 | 2 | ... | p | ... | P |
|---|---|---|---|---|---|---|
| CORRECTION AMOUNTS | $\Delta X_{11}, \Delta Y_{11}$ | $\Delta X_{12}, \Delta Y_{12}$ | ... | $\Delta X_{1p}, \Delta Y_{1p}$ | ... | $\Delta X_{1P}, \Delta Y_{1P}$ |
| COLUMN (Y-COORDINATE) | 1 | 2 | ... | q | ... | Q |
| CORRECTION AMOUNTS (AMOUNTS OF DISPLACEMENT) | | $\Delta X_{21}, \Delta Y_{21}$ | ... | $\Delta X_{q1}, \Delta Y_{q1}$ | ... | $\Delta X_{Q1}, \Delta Y_{Q1}$ |

CORRECTION TABLE IN WHICH CORRECTION AMOUNTS (AMOUNTS OF DISPLACEMENT) WITH RESPECT TO THEORETICAL COORDINATES ACQUIRED WITH AUXILIARY CAMERA ARE STORED

5b

| ROW (X-COORDINATE) | 1 | 2 | ... | p | ... | P |
|---|---|---|---|---|---|---|
| CORRECTION AMOUNTS | $\Delta X_{11}, \Delta Y_{11}$ | $\Delta X_{12}, \Delta Y_{12}$ | ... | $\Delta X_{1p}, \Delta Y_{1p}$ | ... | $\Delta X_{1P}, \Delta Y_{1P}$ |
| COLUMN (Y-COORDINATE) | 1 | 2 | ... | q | ... | Q |
| CORRECTION AMOUNTS (AMOUNTS OF DISPLACEMENT) | | $\Delta X_{21}, \Delta Y_{21}$ | ... | $\Delta X_{q1}, \Delta Y_{q1}$ | ... | $\Delta X_{Q1}, \Delta Y_{Q1}$ |

*FIG.8*

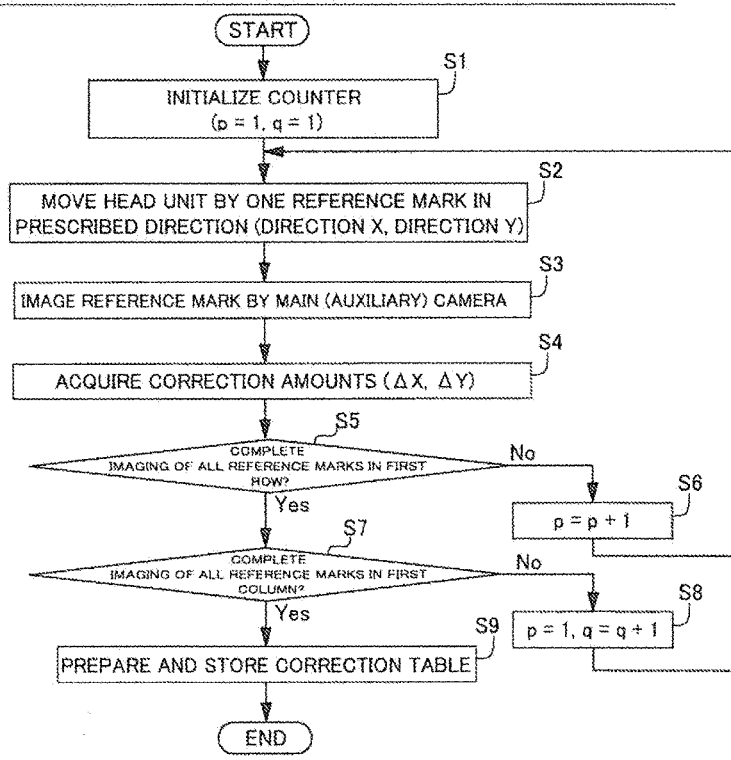

FLOW OF CONTROL PROCESSING PERFORMED BY CENTRAL PROCESSING UNIT OF SURFACE MOUNTER TO PREPARE CORRECTION TABLE

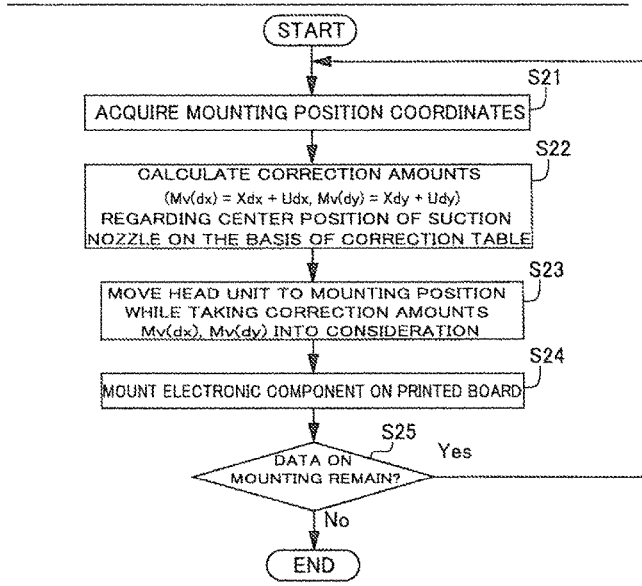
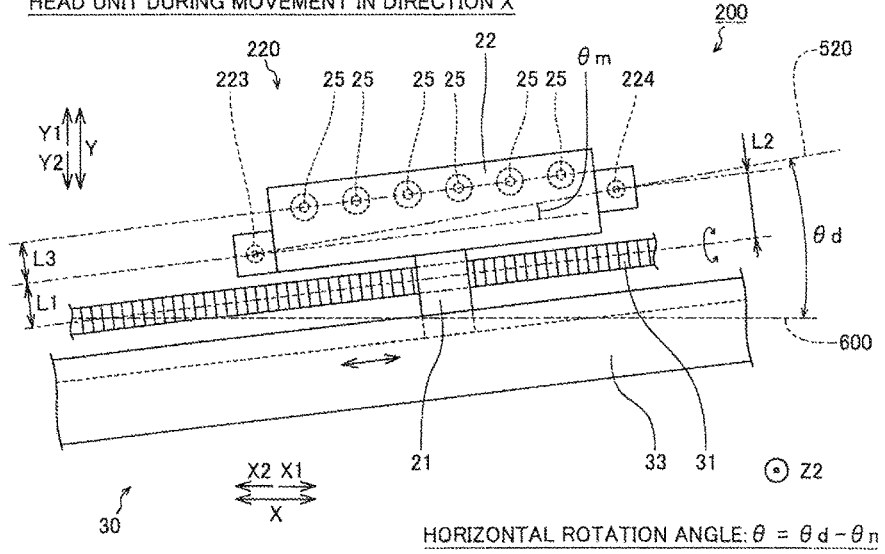

(SECOND EMBODIMENT)

WORKING APPARATUS FOR COMPONENT OR BOARD AND COMPONENT MOUNTING APPARATUS

CROSS-REFERENCE TO RELATED APPLICATION

The priority application number JP2012-110520, Working Apparatus for Component or Board and Component Mounting Apparatus, May 14, 2012, Yasuhiro Suzuki et al., upon which this patent application is based is hereby incorporated by reference.

BACKGROUND OF THE INVENTION

Field of the Invention

The present invention relates to a working apparatus for a component or a board and a component mounting apparatus, and more particularly, it relates to a working apparatus for a component or a board and a component mounting apparatus each including a head unit with imaging portions.

Description of the Background Art

A component mounting apparatus or the like including a head unit with imaging portions is known in general, as disclosed in Japanese Patent Laying-Open No. 2005-347555, for example.

Japanese Patent Laying-Open No. 2005-347555 discloses a component mounting apparatus including a component placing head with two cameras (imaging portions) and component suction nozzles (working mechanism portions) arranged between these cameras, capable of being moved to an arbitrary position on a board. In this component placing head of the component mounting apparatus, the component suction nozzles between the cameras are arranged on a straight line (X-axis) passing through the centers of the two cameras, and the rotation angle (yawing value) of the component placing head with respect to the X-axis in the plane (X-Y plane) of the board can be grasped with the two cameras. In this case, the amounts of displacement (displacement in a direction Y) of the component suction nozzles from the X-axis are obtained on the basis of horizontal distances from the centers of the cameras to the component suction nozzles and the rotation angle of the component placing head. Thus, even if an X-axis frame and a Y-axis frame supporting the component placing head are distorted, the component placing head is moved while the amounts of displacement corresponding to the rotation angle of the component placing head rotated due to the distortion are taken into consideration, and hence the component suction nozzles are accurately moved to component mounting positions.

In the component placing head of the component mounting apparatus described in Japanese Patent Laying-Open No. 2005-347555, the component suction nozzles are arranged on the straight line (X-axis) passing through the centers of the two cameras, so that the amounts of displacement (displacement in the direction Y) of the component suction nozzles are easily grasped on the basis of center-to-center distances between the cameras and the component suction nozzles and the rotation angle of the component placing head. However, in the component placing head in which the component suction nozzles are arranged at positions displaced from the straight line passing through the centers of the two cameras, for example, it is difficult to grasp the amounts of displacement of the component suction nozzles by directly applying the aforementioned method. Therefore, according to the structure described in Japanese Patent Laying-Open No. 2005-347555, the component suction nozzles (working mechanism portions) cannot be accurately moved to the component mounting positions (working positions) in the case of the component placing head in which the component suction nozzles (working mechanism portions) are not arranged on the straight line passing through the centers of the imaging portions.

SUMMARY OF THE INVENTION

The present invention has been proposed in order to solve the aforementioned problem, and an object of the present invention is to provide a working apparatus for a component or a board and a component mounting apparatus each capable of accurately moving a working mechanism portion to a working position even if the working mechanism portion is not arranged on a straight line passing through the centers of imaging portions.

In order to attain the aforementioned object, a working apparatus for a component or a board according to a first aspect of the present invention includes a head unit including a first imaging portion, a second imaging portion, and a working mechanism portion arranged at a position other than on a straight line passing through the center of the first imaging portion and the center of the second imaging portion in a plan view and a control portion performing control of moving the head unit in a horizontal plane, while the control portion is configured to perform control of calculating a rotation angle in the horizontal plane of the head unit from displacement of the center of the first imaging portion and displacement of the center of the second imaging portion and correcting the center position of the working mechanism portion on the basis of the amount of rotation-induced displacement of the center of the working mechanism portion due to the rotation angle, a first amount of displacement in a first direction in the horizontal plane being not induced by rotation of the center of the working mechanism portion, and a second amount of displacement in a second direction orthogonal to the first direction in the horizontal plane being not induced by the rotation of the center of the working mechanism portion when moving the head unit.

In the working apparatus for a component or a board according to the first aspect of the present invention, as hereinabove described, the control portion is configured to perform control of calculating the rotation angle in the horizontal plane of the head unit from the displacement of the center of the first imaging portion and the displacement of the center of the second imaging portion and correcting the center position of the working mechanism portion on the basis of the amount of rotation-induced displacement of the center of the working mechanism portion due to the rotation angle, the first amount of displacement in the first direction in the horizontal plane being not induced by the rotation of the center of the working mechanism portion, and the second amount of displacement in the second direction orthogonal to the first direction in the horizontal plane being not induced by the rotation of the center of the working mechanism portion when moving the head unit, whereby the control portion can properly correct the center position of the working mechanism portion with the rotation angle of the head unit, the first amount of displacement in the first direction being not induced by the rotation, and the second amount of displacement in the second direction being not induced by the rotation when moving the head unit even if the head unit in which the working mechanism portion is not arranged on the straight line passing through the center of the first imaging portion and the center of the second imaging portion is used. Thus, the control portion can accurately move the working mechanism portion to a working position for the component or the board.

In the aforementioned working apparatus for a component or a board according to the first aspect, the control portion is preferably configured to perform control of correcting the center position of the working mechanism portion and moving the head unit on the basis of the rotation angle in the horizontal plane of the head unit, the amount of rotation-induced displacement, the first amount of displacement being not induced by the rotation of the center of the working mechanism portion, and the second amount of displacement being not induced by the rotation of the center of the working mechanism portion, when an operation on the component or the board is performed with the head unit. According to this structure, it is only necessary for the control portion to calculate the correction amount of the center position of the working mechanism portion each time the operation on the component or the board is performed. Therefore, as compared with a case where the correction amounts of the center position of the working mechanism portion corresponding to a large number of working positions are obtained in a matrix manner to cover an entire region in the horizontal plane and are previously prepared (stored) as data in the working apparatus, for example, it is not necessary to hold a large amount of data, so that the amount of data held in the working apparatus can be significantly reduced.

In the aforementioned structure in which the control portion performs control of correcting the center position of the working mechanism portion and moving the head unit when the operation on the component or the board is performed, the control portion is preferably configured to perform control of correcting the center position of the working mechanism portion and moving the head unit on the basis of the rotation angle in the horizontal plane of the head unit, the amount of rotation-induced displacement, the first amount of displacement being not induced by the rotation of the center of the working mechanism portion, and the second amount of displacement being not induced by the rotation of the center of the working mechanism portion, each time a single operation on the individual component or the individual board is performed. According to this structure, the control of correcting the center position of the working mechanism portion and moving the head unit is performed once in every operation on the individual component or the individual board, and hence the working mechanism portion can be accurately moved to the corresponding working position each time an operation is performed on each component or each board at a different working position.

In the aforementioned structure in which the control portion performs control of correcting the center position of the working mechanism portion and moving the head unit when the operation on the component or the board is performed, the control portion is preferably configured to perform arithmetic processing for correcting the center position of the working mechanism portion and perform control of moving the head unit on the basis of the rotation angle in the horizontal plane of the head unit, the amount of rotation-induced displacement, the first amount of displacement being not induced by the rotation of the center of the working mechanism portion, and the second amount of displacement being not induced by the rotation of the center of the working mechanism portion. According to this structure, the head unit can be moved actually while the arithmetic processing for correcting the center position of the working mechanism portion is performed, and hence the takt time required for the operation on the component or the board can be inhibited from increasing due to the arithmetic processing.

In the aforementioned working apparatus for a component or a board according to the first aspect, the amount of rotation-induced displacement preferably includes the first amount of rotation-induced displacement in the first direction of the center position of the working mechanism portion based on the rotation angle and distances in the first and second directions from the center position of the working mechanism portion to the center position of the first imaging portion or the second imaging portion and the second amount of rotation-induced displacement in the second direction of the center position of the working mechanism portion based on the rotation angle and the distances in the first and second directions from the center position of the working mechanism portion to the center position of the first imaging portion or the second imaging portion, and the control portion is preferably configured to perform control of correcting the center position of the working mechanism portion on the basis of the first correction amount in the first direction of the center position of the working mechanism portion based on the first amount of rotation-induced displacement and the first amount of displacement and the second correction amount in the second direction of the center position of the working mechanism portion based on the second amount of rotation-induced displacement and the second amount of displacement. According to this structure, the first amount of rotation-induced displacement and the second amount of rotation-induced displacement can be easily grasped on the basis of the positional relation between the center position of the working mechanism portion and the center position of the first imaging portion or the second imaging portion in the head unit, and the first correction amount in the first direction and the second correction amount in the second direction of the center position of the working mechanism portion in the head unit in motion can be accurately obtained on the basis of the first and second amounts of rotation-induced displacement induced by this rotational movement and the first and second amounts of displacement being not induced by the rotation of the center of the working mechanism portion.

In the aforementioned structure in which the amount of rotation-induced displacement includes the first amount of rotation-induced displacement and the second amount of rotation-induced displacement, the first correction amount is preferably a sum of the first amount of rotation-induced displacement and the first amount of displacement, and the second correction amount is preferably a sum of the second amount of rotation-induced displacement and the second amount of displacement. According to this structure, the control portion can easily calculate the correction amount (first correction amount) in the first direction and the correction amount (second correction amount) in the second direction of the center position of the working mechanism portion.

In the aforementioned structure in which the amount of rotation-induced displacement includes the first amount of rotation-induced displacement and the second amount of rotation-induced displacement, the control portion is preferably configured to perform control of moving the center position of the working mechanism portion to position coordinates obtained by subtracting the first correction amount in the first direction and the second correction amount in the second direction from the theoretical position coordinates of the center position of the working mechanism portion, respectively, when moving the head unit. According to this structure, the center position of the working mechanism portion can be easily corrected with the first and second correction amounts in the arithmetic processing performed by the control portion, and hence the working mechanism portion of the head unit can be easily moved to a working position after correction.

The aforementioned working apparatus for a component or a board according to the first aspect preferably further includes a correction table to which the control portion refers for the amount of displacement of the actual position coordinates of the center of the first imaging portion with respect to the theoretical position coordinates of the center of the first imaging portion and the amount of displacement of the actual position coordinates of the center of the second imaging portion with respect to the theoretical position coordinates of the center of the second imaging portion when moving the head unit in the horizontal plane, and the control portion is preferably configured to perform control of calculating the rotation angle in the horizontal plane of the head unit from the displacement of the center of the first imaging portion and the displacement of the center of the second imaging portion grasped on the basis of the correction table and correcting the center position of the working mechanism portion on the basis of the amount of rotation-induced displacement of the center of the working mechanism portion due to the rotation angle, the first amount of displacement being not induced by the rotation of the center of the working mechanism portion, and the second amount of displacement being not induced by the rotation of the center of the working mechanism portion when moving the head unit. According to this structure, the arithmetic processing for correcting the center position of the working mechanism portion can be promptly performed on the basis of the rotation angle in the horizontal plane of the head unit, the amount of rotation-induced displacement, and the first and second amounts of displacement being not induced by the rotation of the center of the working mechanism portion, effectively utilizing the correction table.

In this case, the correction table preferably includes a first correction table in which the amount of displacement of the actual position coordinates of the center of the first imaging portion with respect to the theoretical position coordinates of the center of the first imaging portion is defined and a second correction table in which the amount of displacement of the actual position coordinates of the center of the second imaging portion with respect to the theoretical position coordinates of the center of the second imaging portion is defined, and the amount of rotation-induced displacement is preferably calculated with the first correction table and the second correction table while the first amount of displacement and the second amount of displacement being not induced by the rotation of the center of the working mechanism portion are preferably calculated with the first correction table or the second correction table. According to this structure, the amount of rotation-induced displacement of the center of the working mechanism portion can be easily calculated with the first and second correction tables, and the first and second amounts of displacement being not induced by the rotation of the center of the working mechanism portion can be easily calculated, effectively utilizing either the first correction table or the second correction table.

The aforementioned working apparatus for a component or a board according to the first aspect preferably further includes a moving mechanism portion so configured that the head unit is movable in the horizontal plane, and the control portion is preferably configured to perform control of calculating the rotation angle in the horizontal plane of the head unit from the displacement of the center of the first imaging portion and the displacement of the center of the second imaging portion resulting from distortion of the moving mechanism portion and correcting the center position of the working mechanism portion on the basis of the amount of rotation-induced displacement of the center of the working mechanism portion due to the rotation angle, the first amount of displacement being not induced by the rotation of the center of the working mechanism portion, and the second amount of displacement being not induced by the rotation of the center of the working mechanism portion when moving the head unit by the moving mechanism portion. According to this structure, even if the moving mechanism portion moving the head unit is distorted, the center position of the working mechanism portion can be properly corrected with the amount of rotation-induced displacement of the center of the working mechanism portion resulting from rotation of the head unit due to the distortion of the moving mechanism portion and the first and second amounts of displacement being not induced by the rotation when the head unit is moved.

In this case, the moving mechanism portion preferably includes a rail member extending in the first direction to move the head unit along the first direction, and the control portion is preferably configured to perform control of calculating the rotation angle in the horizontal plane of the head unit from the displacement of the center of the first imaging portion and the displacement of the center of the second imaging portion resulting from deformation of the rail member in the second direction and correcting the center position of the working mechanism portion on the basis of the amount of rotation-induced displacement of the center of the working mechanism portion due to the rotation angle, the first amount of displacement being not induced by the rotation of the center of the working mechanism portion, and the second amount of displacement being not induced by the rotation of the center of the working mechanism portion when moving the head unit. According to this structure, even if the rail member extending in the first direction is deformed such as undulated in the second direction, the center position of the working mechanism portion can be properly corrected with the amount of rotation-induced displacement of the center of the working mechanism portion resulting from the rotation of the head unit moving on the rail member due to the deformation of the rail member and the first and second amounts of displacement being not induced by the rotation when the head unit is moved.

In the aforementioned working apparatus for a component or a board according to the first aspect, a plurality of working mechanism portions are preferably provided on the head unit, and the control portion is preferably configured to perform control of calculating the rotation angle in the horizontal plane of the head unit from the displacement of the center of the first imaging portion and the displacement of the center of the second imaging portion for each of the plurality of working mechanism portions and individually correcting each of the center positions of the working mechanism portions on the basis of the amount of rotation-induced displacement of each of the centers of the working mechanism portions due to the rotation angle, the first amount of displacement being not induced by the rotation of each of the centers of the working mechanism portions, and the second amount of displacement being not induced by the rotation of each of the centers of the working mechanism portions when moving the head unit. According to this structure, also when the head unit has the plurality of working mechanism portions, the control portion performs control of correcting the respective center positions of the working mechanism portions and moving the head unit, so that the working mechanism portions corresponding to the respective working positions can be accurately moved with respect to all operations performed with this head unit.

In the aforementioned working apparatus for a component or a board according to the first aspect, the head unit is preferably configured to be movable along the first direction, the first imaging portion and the second imaging portion are preferably arranged at positions aligned in the first direction, the first amount of displacement and the second amount of displacement of the working mechanism portion each preferably include a first component based on displacement of the center position of the first imaging portion or the second imaging portion from the theoretical position coordinates of the center position of the first imaging portion or the second imaging portion, and the control portion is preferably configured to perform control of correcting the center position of the working mechanism portion on the basis of the amount of rotation-induced displacement of the center of the working mechanism portion, the rotation angle in the horizontal plane of the head unit, the first amount of displacement including the first component, being not induced by the rotation, and the second amount of displacement including the first component, being not induced by the rotation. According to this structure, the control portion can properly correct the center position of the working mechanism portion when moving the head unit in which the first imaging portion and the second imaging portion are aligned in the first direction. Consequently, the working mechanism portion can be accurately moved to the working position for the component or the board.

In the aforementioned working apparatus for a component or a board according to the first aspect, the head unit is preferably configured to be movable along the first direction, the second imaging portion is preferably arranged at a different position in the second direction with respect to the first imaging portion, the first amount of displacement and the second amount of displacement of the working mechanism portion each preferably include a second component based on positional displacement of the second imaging portion along the second direction with respect to the first imaging portion in addition to the first component based on the displacement of the center position of the first imaging portion or the second imaging portion from the theoretical position coordinates of the center position of the first imaging portion or the second imaging portion, and the control portion is preferably configured to perform control of correcting the center position of the working mechanism portion on the basis of the amount of rotation-induced displacement of the center of the working mechanism portion, the rotation angle in the horizontal plane of the head unit, the first amount of displacement including the first and second components, being not induced by the rotation, and the second amount of displacement including the first and second components, being not induced by the rotation. According to this structure, the control portion can properly correct the center position of the working mechanism portion by taking the second component based on the positional displacement in the second direction into consideration when moving the head unit even if the head unit in which the second imaging portion is arranged at the different position in the second direction with respect to the first imaging portion is used. Consequently, the working mechanism portion can be accurately moved to the working position for the component or the board.

In the aforementioned working apparatus for a component or a board according to the first aspect, the head unit preferably further includes a slide guide portion provided to be movable along the first direction and guiding movement of the head unit in the first direction, the center position of the slide guide portion rotationally displaced along with rotation of the center position of the first imaging portion or the second imaging portion is preferably grasped on the basis of the rotation angle and the positional relation between the slide guide portion and the first imaging portion or the second imaging portion, the amount of rotation-induced displacement is preferably calculated on the basis of the rotation angle and the positional relation between the grasped center position of the slide guide portion and the center position of the working mechanism portion, and the control portion is preferably configured to perform control of correcting the center position of the working mechanism portion on the basis of the amount of rotation-induced displacement, the first amount of displacement being not induced by the rotation, and the second amount of displacement being not induced by the rotation. According to this structure, the center position of the working mechanism portion based on the displacement of the center position of the first imaging portion or the second imaging portion can be corrected also by taking the positional information regarding the rotational displacement of the slide guide portion lying between the first imaging portion or the second imaging portion and the working mechanism portion into consideration in the arithmetic processing in addition to a case of correcting the center position of the working mechanism portion on the basis of only the relation between the center position of the first imaging portion or the second imaging portion and the center position of the working mechanism portion. In other words, the center position regarding the rotational displacement of the slide guide portion actually moving the head unit on the basis of the rotation angle is first grasped (predicted), and then the amount of rotation-induced displacement of the center position of the working mechanism portion induced by the grasped rotational displacement of the center position of the slide guide portion is calculated, whereby the final correction amount of the center position of the working mechanism portion can be calculated. Thus, the working mechanism portion can be accurately moved to the working position also by the aforementioned method.

A component mounting apparatus according to a second aspect of the present invention includes a head unit including a first imaging portion, a second imaging portion, and a suction nozzle arranged at a position other than on a straight line passing through the center of the first imaging portion and the center of the second imaging portion in a plan view and a control portion performing control of moving the head unit in a horizontal plane, while the control portion is configured to perform control of calculating a rotation angle in the horizontal plane of the head unit from displacement of the center of the first imaging portion and displacement of the center of the second imaging portion and correcting the center position of the suction nozzle on the basis of the amount of rotation-induced displacement of the center of the suction nozzle due to the rotation angle, a first amount of displacement in a first direction in the horizontal plane being not induced by rotation of the center of the suction nozzle, and a second amount of displacement in a second direction orthogonal to the first direction in the horizontal plane being not induced by the rotation of the center of the suction nozzle when moving the head unit.

In the component mounting apparatus according to the second aspect of the present invention, as hereinabove described, the control portion is configured to perform control of calculating the rotation angle in the horizontal plane of the head unit from the displacement of the center of the first imaging portion and the displacement of the center of the second imaging portion and correcting the center position of the suction nozzle on the basis of the amount of rotation-induced displacement of the center of the suction nozzle due to the rotation angle, the first amount of displacement in the first direction in the horizontal plane being not induced by the rotation of the center of the suction nozzle, and the second amount of displacement in the second direction orthogonal to the first direction in the horizontal plane being not induced by the rotation of the center of the suction nozzle when moving the head unit, whereby the control portion can properly correct the center position of the suction nozzle with the rotation angle of the head unit, the first amount of displacement in the first direction being not induced by the rotation, and the second amount of displacement in the second direction being not induced by the rotation when moving the head unit even if the head unit in which the suction nozzle is not arranged on the straight line passing through the center of the first imaging portion and the center of the second imaging portion is used. Thus, the control portion can accurately move the suction nozzle to a mounting position to mount a component.

In the aforementioned component mounting apparatus according to the second aspect, the control portion is preferably configured to perform control of correcting the center position of the suction nozzle and moving the head unit on the basis of the rotation angle in the horizontal plane of the head unit, the amount of rotation-induced displacement, the first amount of displacement being not induced by the rotation of the center of the suction nozzle, and the second amount of displacement being not induced by the rotation of the center of the suction nozzle, when a component mounting operation is performed with the head unit. According to this structure, it is only necessary for the control portion to calculate the correction amount of the center position of the suction nozzle each time the component mounting operation is performed. Therefore, as compared with a case where the correction amounts of the center position of the suction nozzle corresponding to a large number of component mounting positions are obtained in a matrix manner to cover an entire region in the horizontal plane and are previously prepared (stored) as data in the component mounting apparatus, for example, it is not necessary to hold a large amount of data, so that the amount of data held in the component mounting apparatus can be significantly reduced.

In the aforementioned component mounting apparatus according to the second aspect, the amount of rotation-induced displacement preferably includes the first amount of rotation-induced displacement in the first direction of the center position of the suction nozzle based on the rotation angle and distances in the first and second directions from the center position of the suction nozzle to the center position of the first imaging portion or the second imaging portion and the second amount of rotation-induced displacement in the second direction of the center position of the suction nozzle based on the rotation angle and the distances in the first and second directions from the center position of the suction nozzle to the center position of the first imaging portion or the second imaging portion, and the control portion is preferably configured to perform control of correcting the center position of the suction nozzle on the basis of the first correction amount in the first direction of the center position of the suction nozzle based on the first amount of rotation-induced displacement and the first amount of displacement and the second correction amount in the second direction of the center position of the suction nozzle based on the second amount of rotation-induced displacement and the second amount of displacement. According to this structure, the first amount of rotation-induced displacement and the second amount of rotation-induced displacement can be easily grasped on the basis of the positional relation between the center position of the suction nozzle and the center position of the first imaging portion or the second imaging portion in the head unit, and the first correction amount in the first direction and the second correction amount in the second direction of the center position of the suction nozzle in the head unit in motion can be accurately obtained on the basis of the first and second amounts of rotation-induced displacement induced by this rotational movement and the first and second amounts of displacement being not induced by the rotation of the center of the suction nozzle.

In the aforementioned component mounting apparatus according to the second aspect, the head unit is preferably configured to be movable along the first direction, the second imaging portion is preferably arranged at a different position in the second direction with respect to the first imaging portion, the first amount of displacement and the second amount of displacement of the suction nozzle each preferably include a second component based on positional displacement of the second imaging portion along the second direction with respect to the first imaging portion in addition to a first component based on displacement of the center position of the first imaging portion or the second imaging portion from the theoretical position coordinates of the center position of the first imaging portion or the second imaging portion, and the control portion is preferably configured to perform control of correcting the center position of the suction nozzle on the basis of the amount of rotation-induced displacement of the center of the suction nozzle, the rotation angle in the horizontal plane of the head unit, the first amount of displacement including the first and second components, being not induced by the rotation, and the second amount of displacement including the first and second components, being not induced by the rotation. According to this structure, the control portion can properly correct the center position of the suction nozzle by taking the second component based on the positional displacement in the second direction into consideration when moving the head unit even if the head unit in which the second imaging portion is arranged at the different position in the second direction with respect to the first imaging portion is used. Consequently, the suction nozzle can be accurately moved to a component mounting position.

In the aforementioned component mounting apparatus according to the second aspect, the head unit preferably further includes a slide guide portion provided to be movable along the first direction and guiding movement of the head unit in the first direction, the center position of the slide guide portion rotationally displaced along with rotation of the center position of the first imaging portion or the second imaging portion is preferably grasped on the basis of the rotation angle and the positional relation between the slide guide portion and the first imaging portion or the second imaging portion, the amount of rotation-induced displacement is preferably calculated on the basis of the rotation angle and the positional relation between the grasped center position of the slide guide portion and the center position of the suction nozzle, and the control portion is preferably configured to perform control of correcting the center position of the suction nozzle on the basis of the amount of rotation-induced displacement, the first amount of displacement being not induced by the rotation, and the second amount of displacement being not induced by the rotation. According to this structure, the center position of the suction nozzle based on the displacement of the center position of the first imaging portion or the second imaging portion can be corrected also by taking the positional information regarding the rotational displacement of the slide guide portion lying between the first imaging portion or the second imaging portion and the suction nozzle into consideration in the arithmetic processing in addition to a case of correcting the center position of the suction nozzle on the basis of only the relation between the center position of the first imaging portion or the second imaging portion and the center position of the suction nozzle. In other words, the center position regarding the rotational displacement of the slide guide portion actually moving the head unit on the basis of the rotation angle is first grasped (predicted), and then the amount of rotation-induced displacement of the center position of the suction nozzle induced by the grasped rotational displacement of the center position of the slide guide portion is calculated, whereby the final correction amount of the center position of the suction nozzle can be calculated. Thus, the suction nozzle can be accurately moved to the component mounting position also by the aforementioned method.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 illustrates a method for calculating the amounts of displacement (correction amounts) of a suction nozzle from the theoretical position coordinates thereof associated with the displacement of the head unit shown in FIG. 4;

FIG. 6 illustrates a jig plate used when the amount of distortion of the surface mounter according to the first embodiment of the present invention is previously measured with a main camera and an auxiliary camera;

FIG. 7 illustrates correction tables prepared on the basis of the amount of distortion measured on the basis of the jig plate and stored in a memory in the surface mounter according to the first embodiment of the present invention;

FIG. 8 illustrates the flow of processing performed by a central processing unit to previously measure the amount of distortion of the surface mounter according to the first embodiment of the present invention with the main camera and the auxiliary camera;

FIG. 9 illustrates the flow of processing performed by the central processing unit to mount electronic components by driving the head unit in the surface mounter according to the first embodiment of the present invention;

FIG. 10 illustrates a state where a head unit in motion is rotationally moved in a horizontal plane due to the distortion of a guide rail in a surface mounter according to a second embodiment of the present invention;

DESCRIPTION OF THE PREFERRED EMBODIMENTS

Embodiments of the present invention are now described with reference to the drawings.

(First Embodiment)

First, the structure of a surface mounter 100 according to a first embodiment of the present invention is described with reference to FIGS. 1 to 7. The surface mounter 100 is an example of the "working apparatus for a component or a board" or the "component mounting apparatus" in the present invention.

Figure 1:
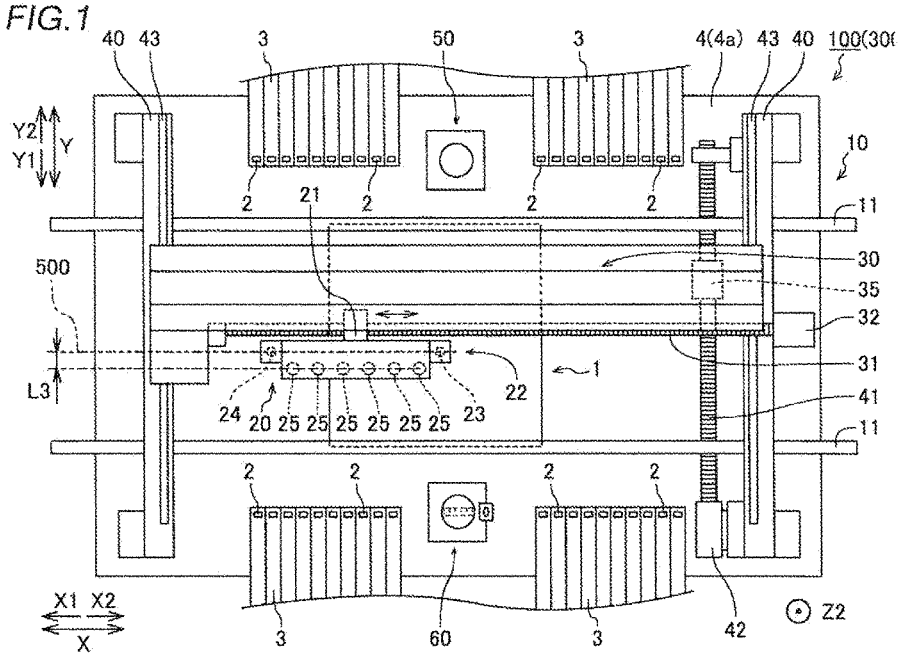
FIG. 1 is a plan view showing the structure of a surface mounter according to a first embodiment of the present invention.
Figure 2:
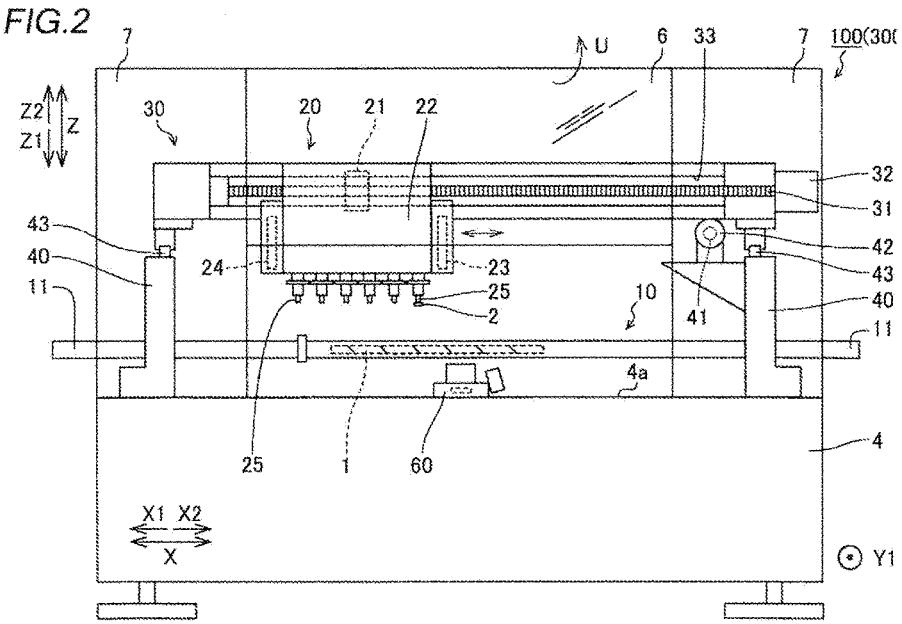
FIG. 2 is a side elevational view of the surface mounter according to the first embodiment of the present invention, as viewed along a depth direction (arrow Y2)

The surface mounter 100 according to the first embodiment of the present invention is an apparatus for mounting electronic components 2 on a printed board (wiring board) 1, as shown in FIGS. 1 and 2. The surface mounter 100 includes a base 4, a board conveying portion 10 provided on the base 4 (front side in the plane of the figure), a head unit 20 movable along an X-Y plane (plane of the figure) above the board conveying portion 10, a support portion 30 supporting the head unit 20 to be movable in a direction X, and a moving mechanism 40 moving the support portion 30 in a direction Y, as shown in FIG. 1. The electronic components 2 are examples of the "component" in the present invention. The directions X and Y are examples of the "first direction" and the "second direction" in the present invention, respectively.

A plurality of rows of tape feeders 3 to supply the electronic components 2 are arranged on both sides (Y1 and Y2 sides) of the board conveying portion 10. The tape feeders 3 hold reels (not shown) on which tapes holding a plurality of electronic components 2 at prescribed intervals are wound. The reels are rotated to send out the tapes, whereby the electronic components 2 are supplied from forward end portions of the tape feeders 3. The head unit 20 acquires the electronic components 2 from the tape feeders 3, and has a function of mounting the electronic components 2 on the printed board 1 placed on the board conveying portion 10. The electronic components 2 are small pieces of electronic components such as ICs, transistors, capacitors, and resistors.

In the surface mounter 100, a cover 6 is attached to a casing 7 provided on the base 4, as shown in FIG. 2. The cover 6 is configured to pivot upward (along arrow U) relative to the casing 7, and is so configured that a user (operator) can access the board conveying portion 10. In FIG. 2, the internal structure that is covered with the casing 7 and unseen from the outside under normal circumstances is also shown by solid lines for convenience of illustration.

Figure 3:
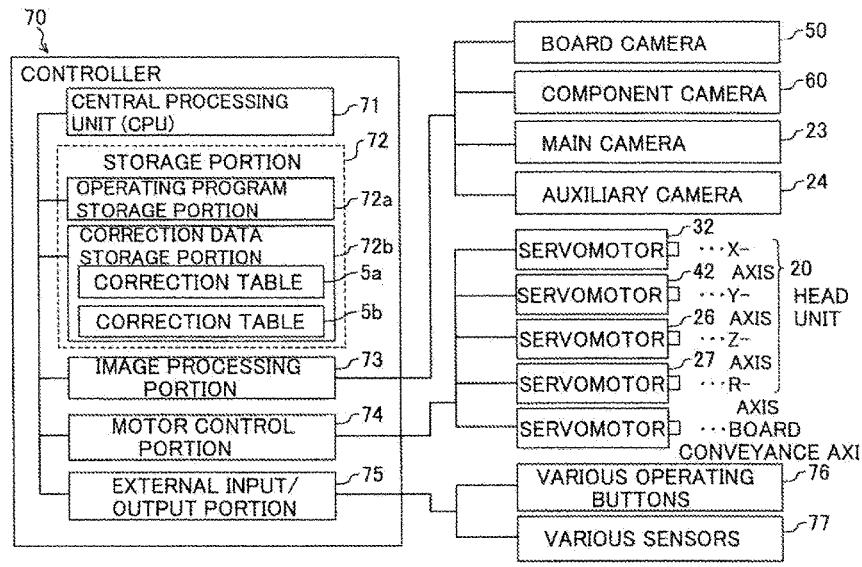
FIG. 3 is a block diagram showing the control structure of the surface mounter according to the first embodiment of the present invention.

As shown in FIG. 3, a controller 70 to perform operational control of each portion of a mounter body is built in the surface mounter 100. The controller 70 is mainly constituted by a central processing unit (CPU) 71, a storage portion 72 (an operating program storage portion 72a and a correction data storage portion 72b), an image processing portion 73, a motor control portion 74, and an external input/output portion 75. Components constituting the controller 70 are later described in detail. The central processing unit 71 is an example of the "control portion" in the present invention.

The board conveying portion 10 includes a pair of conveyor portions 11 extending in the direction X that is the conveying direction of the printed board 1, as shown in FIG. 1. The conveyor portions 11 are provided with a plurality of board sensors (not shown) detecting the conveying condition of the printed board 1. Thus, the printed board 1 held by the conveyor portions 11 is conveyed on the basis of the detection results of the board sensors. The board conveying portion 10 is internally provided with a clamp mechanism holding the printed board 1 being conveyed while stopping the printed board 1 at a stop position during mounting of the components.

The support portion 30 has a ball screw shaft 31 extending in the direction X, a servomotor 32 rotating the ball screw shaft 31, and a guide rail 33 extending along the ball screw shaft 31, as shown in FIG. 2. The head unit 20 has a slide guide portion 21 attached with a ball nut (not shown) receiving the ball screw shaft 31. Thus, the head unit 20 is moved back and forth along the direction X following the rotation of the ball screw shaft 31 while the slide guide portion 21 is guided by the guide rail 33. The support portion 30 is an example of the "moving mechanism portion" in the present invention, and the guide rail 33 is an example of the "rail member" in the present invention.

The support portion 30 is configured to be movable in the direction Y orthogonal to the direction X in a state where the same is placed on the moving mechanism 40 fixed onto the base 4. Specifically, the moving mechanism 40 has a ball screw shaft 41 extending in the direction Y, a servomotor 42 rotating the ball screw shaft 41, and a pair of guide rails 43 extending along the ball screw shaft 41, as shown in FIG. 1. The guide rails 43 movably support both end portions (in the direction X) of the support portion 30. The support portion 30 is provided with a ball nut 35 receiving the ball screw shaft 41. Thus, the ball nut 35 is moved back and forth in the direction Y following the rotation of the ball screw shaft 41 while the support portion 30 is guided by the guide rails 43. Therefore, the head unit 20 is configured to be capable of moving to an arbitrary position along the X-Y plane over the base 4 by rotating the ball screw shafts 31 and 41.

The head unit 20 has a mounting head 22 fixed to the slide guide portion 21 and a main camera 23 and an auxiliary camera 24 respectively attached to both end portions (in the direction X) of the mounting head 22, as shown in FIG. 2. The distance of the main camera 23 from the ball screw shaft 31 (X-axis) and the distance of the auxiliary camera 24 from the ball screw shaft 31 are substantially equal to each other. In other words, a straight line (X-axis) 500 passing through the centers of the main camera 23 and the auxiliary camera 24 and the ball screw shaft 31 are substantially parallel to each other, as shown in FIG. 1. The mounting head 22 has a plurality of (six) suction nozzles 25 provided on the lower surface side (Z1 side in FIG. 2) opposed to the printed board 1. As shown in FIG. 1, each of the suction nozzles 25 is arranged at a position offset by a distance L3 along arrow Y1 from the straight line 500. As shown in FIG. 2, each of the suction nozzles 25 has a function of holding an electronic component 2 by suctioning the electronic component 2 with negative pressure generated in a forward end portion of the nozzle by a negative pressure generator (not shown). The main camera 23 and the auxiliary camera 24 are examples of the "first imaging portion" and the "second imaging portion" in the present invention, respectively. The suction nozzles 25 are examples of the "working mechanism portion" in the present invention.

Even if the guide rail 33 that is an elongated member is accurately designed and manufactured, the shape of the guide rail 33 is slightly distorted. In other words, the guide rail 33 is not completely straight along the direction X, but has undulation as a whole with small displacement in the direction Y. When the slide guide portion 21 moves in the direction X while sliding along the guide rail 33 following the rotation of the ball screw shaft 31, therefore, the slide guide portion 21 and the head unit 20 move while slightly swaying from side to side with respect to the X-axis in a horizontal plane (X-Y plane) due to the undulation of the sliding surface.

Figure 4:
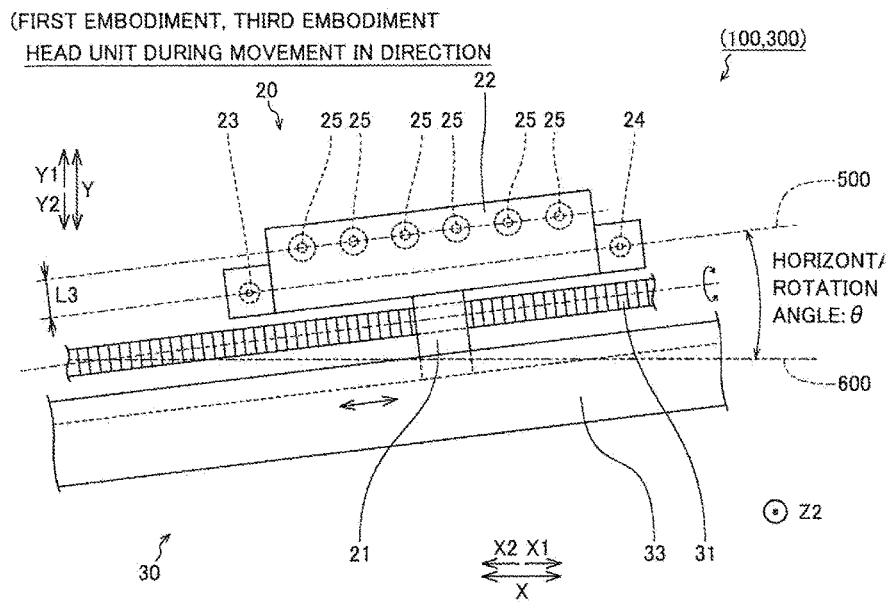
FIG. 4 illustrates a state where a head unit in motion is rotationally moved in a horizontal plane due to the distortion of a guide rail in the surface mounter according to the first embodiment of the present invention.

For example, it is assumed that the head unit 20 is moved to a mounting position on the printed board 1 (see FIG. 1), as shown in FIG. 4. In other words, it is assumed that the head unit 20 is parallel moved by a prescribed amount along arrow Y1 due to the undulation of the sliding surface and further rotated slightly counterclockwise by a horizontal rotation angle θ from the displaced position. In FIG. 4, the magnitude of the horizontal rotation angle θ is illustrated in an exaggerated manner for convenience, and actually, the posture of the head unit 20 is not changed so much. In FIG. 4, the periphery of the head unit 20 is schematically shown in a state where the surface mounter 100 shown in FIG. 1 is turned upside down in an anteroposterior direction (direction Y) for convenience of description.

According to the first embodiment, the following drive control is applied to the head unit 20 in which the center positions of the suction nozzles 25 are displaced by the distance L3 along arrow Y1 from the straight line 500 passing through the center position of the main camera 23 and the center position of the auxiliary camera 24.

In other words, according to the first embodiment, the central processing unit 71 (see FIG. 3) adjusts the numbers of rotations of the servomotors 32 and 42 (see FIG. 3) while taking the previously grasped distortion (undulation) of the guide rail 33 into consideration and performs control of moving the head unit 20. This drive control is performed for each mounting operation on each of the electronic components 2 (see FIG. 2). Thus, a suction nozzle 25 suctioning the electronic component 2 can be accurately moved to a prescribed mounting position of the printed board 1 each time. Operations performed by the central processing unit 71 in order to perform this drive control are hereinafter described in detail.

Arithmetic processing performed to mount one electronic component 2 is summarized below. First, the amount of movement Mv(dx) in the direction X of the center position of the suction nozzle 25 and the amount of movement Mv(dy) in the direction Y of the center position of the suction nozzle 25 are calculated on the basis of the horizontal rotation angle θ of the head unit 20 (see FIG. 4) in the X-Y plane and the amount of X-direction displacement Xdx of the suction nozzle 25 and the amount of Y-direction displacement Xdy of the suction nozzle 25 (see FIG. 4) induced by the displacement of the center position of the main camera 23 from the theoretical center position thereof, as shown in FIG. 5. Then, the aforementioned calculated amounts of movement Mv(dx) and Mv(dy) are immediately subtracted as correction amounts from the mounting position coordinates of the electronic component 2 specified on a control program, and the amounts of control (numbers of rotations of the servomotors) are obtained while the amounts of displacement are taken into consideration. The horizontal rotation angle θ is an example of the "rotation angle in the horizontal plane" in the present invention. The amounts of movement Mv(dx) and Mv(dy) are examples of the "first correction amount" and the "second correction amount" in the present invention, respectively. The amount of X-direction displacement Xdx and the amount of Y-direction displacement Xdy are examples of the "first amount of displacement" and the "second amount of displacement" in the present invention, respectively. A method for obtaining parameters used in the arithmetic processing is hereinafter described.

First, if there is no distortion (undulation) in the guide rail 33 (see FIG. 4) ideally, the straight line 500 in the head unit 20 and the theoretical X-axis line 600 (see FIG. 4) of the mounter are substantially parallel to each other no matter to which position the head unit 20 is moved, as shown in FIG. 5. In this case, the center position coordinates of the main camera 23 that are a theoretical position are represented by (Xm, Ym), and the center position coordinates of the auxiliary camera 24 that are a theoretical position are represented by (Xs, Ym). The center position coordinates of the suction nozzle 25 that are a theoretical position spaced by the distance L3 from the straight line 500 are represented by (Xu1, Yu1). The relative position Xuo of the suction nozzle 25 in the direction X with respect to the main camera 23 is Xuo=Xu1−Xm, and the relative position Yuo of the suction nozzle 25 in the direction Y with respect to the main camera 23 is Yuo=Yu1−Ym (=L3). In FIG. 5, the posture of the head unit 20 is expressed by a figure G1 (drawn with broken lines) passing through the center positions of the main camera 23, the auxiliary camera 24, and the suction nozzle 25.

Next, when the head unit 20 is moved to reach a certain position in a state where the guide rail 33 has distortion (undulation) actually as shown in FIG. 4, the straight line 500 in the head unit 20 and the X-axis line 600 of the mounter intersect with each other at the horizontal rotation angle θ. In other words, the head unit 20 reaches the position of a figure G2 (drawn with solid lines) by moving obliquely parallel along arrow X1 and arrow Y1 from the position of the figure G1 and further rotating counterclockwise by the horizontal rotation angle θ with respect to the main camera 23 in FIG. 5. Therefore, the center position coordinates of the suction nozzle 25 are rotationally moved from theoretical position coordinates (Xu1, Yu1) in the figure G1 to actual position coordinates (Xu2, Yu2) in the figure G2.

If this behavior of the center position of the suction nozzle 25 is geometrically expressed, the amount of movement Mv(dx) in the direction X of the suction nozzle 25 from the X-coordinate Xu1 as the theoretical position to the X-coordinate Xu2 after rotational movement is expressed as follows:

$$Mv(dx)=Xdx+Udx \quad \text{(expression 1)}$$

The amount of movement Mv(dy) in the direction Y of the suction nozzle 25 from the Y-coordinate Yu1 as the theoretical position to the actual Y-coordinate Yu2 after rotational movement is expressed as follows:

$$Mv(dy)=Xdy+Udy \quad \text{(expression 2)}$$

The amount of X-direction displacement Xdx in the expression 1 is a value calculated as the amount of X-direction displacement of the suction nozzle 25 at a position corresponding to the X-coordinate (Xu1) of the suction nozzle 25 in a correction table 5a (see FIG. 7), described later, acquired regarding the main camera 23. The amount of Y-direction displacement Xdy in the expression 2 is a value calculated as the amount of Y-direction displacement of the suction nozzle 25 at a position corresponding to the Y-coordinate (Yu1) of the suction nozzle 25 in the correction table 5a acquired regarding the main camera 23. Udx and Udy are values calculated as the amount of rotation-induced displacement in the direction X of the suction nozzle 25 induced by rotational movement of the horizontal rotation angle θ and the amount of rotation-induced displacement in the direction Y of the suction nozzle 25 induced by the rotational movement of the horizontal rotation angle θ, respectively. Strictly, the expressions 1 and 2 are expressed as Mv(dx)=Xdx+Ydx+Udx and Mv(dy)=Xdy+Ydy+Udy in calculation formulae (see a second embodiment described later). Although the components Ydx and Ydy are parameters corresponding to the displacement components of the suction nozzle 25 associated with the positional displacement of the auxiliary camera 24 in the direction Y with respect to the main camera 23, in the first embodiment, the main camera 23 and the auxiliary camera 24 are not positionally displaced with respect to each other in the direction Y (both lie on the straight line 500), so that both the components Ydx and Ydy are zero. Thus, the description is omitted. In other words, the amount of X-direction displacement Xdx consists of only the component Xdx based on the displacement of the center position of the main camera 23 from the theoretical position coordinates thereof, and the amount of Y-direction displacement Xdy consists of only the component Xdy based on the displacement of the center position of the main camera 23 from the theoretical position coordinates thereof. The amounts of rotation-induced displacement Udx and Udy are examples of the "first amount of rotation-induced displacement" and the "second amount of rotation-induced displacement" in the present invention, respectively. The components Xdx and Xdy are examples of the "first component" in the present invention.

The horizontal rotation angle θ from the figure G1 to the figure G2 is obtained on the basis of FIG. 5 as follows:

$$\theta=\sin^{-1}((Xdy(S)-Xdy(M))/(Xs-Xm)) \quad \text{(expression 3)}$$

In the expression 3, Xdy(M) is a value calculated as the amount of displacement along arrow Y1 of the center position coordinates of the main camera 23 from the figure G1 to the figure G2 on the basis of the correction table 5a (see FIG. 7) described later, and Xdy(S) is a value calculated as the amount of displacement along arrow Y1 of the center position coordinates of the auxiliary camera 24 from the figure G1 to the figure G2 on the basis of a correction table 5b (see FIG. 7) described later. The correction tables 5a and 5b are acquired by experimentally moving the head unit 20 in the mounter before the electronic components 2 (see FIG. 2) are mounted. This point is described later.

The amounts of rotation-induced displacement Udx and Udy are calculated from linear transformation formulae for coordinates in relation to rotational movement. In other words, the amount of rotation-induced displacement Udx is calculated as follows:

$$Udx=(Xuo\times\cos\theta-Yuo\times\sin\theta)-Xuo \quad \text{(expression 4)}$$

The amount of rotation-induced displacement Udy is calculated as follows:

$$Udy=(Xuo\times\sin\theta+Yuo\times\cos\theta)-Yuo \quad \text{(expression 5)}$$

In other words, in the expression 4, the amount of rotation-induced displacement Udx in the direction X of the center position of the suction nozzle 25 is calculated on the basis of the horizontal rotation angle θ, the relative position Xuo of the center position of the suction nozzle 25 in the direction X with respect to the center position of the main camera 23, and the relative position Yuo of the center position of the suction nozzle 25 in the direction Y with respect to the center position of the main camera 23. In the expression 5, the amount of rotation-induced displacement Udy in the direction Y of the center position of the suction nozzle 25 is calculated on the basis of the horizontal rotation angle θ, the relative position Xuo of the center position of the suction nozzle 25 in the direction X with respect to the center position of the main camera 23, and the relative position Yuo of the center position of the suction nozzle 25 in the direction Y with respect to the center position of the main camera 23.

Thus, according to the first embodiment, the central processing unit 71 derives the amounts of rotation-induced displacement Udx and Udy of the suction nozzle 25 on the basis of the machine coordinates of the main camera 23, the auxiliary camera 24, and the suction nozzle 25 (the center position coordinates (Xm, Ym) of the main camera 23, the center position coordinates (Xs, Ym) of the auxiliary camera 24, and the center position coordinates (Xu1, Yu1) of the suction nozzle 25) constituting the figure G1 and the result of calculation of the horizontal rotation angle θ regarding movement (rotational movement) from the figure G1 to the figure G2 acquired with the main camera 23 and the auxiliary camera 24, and estimates the amounts of movement Mv(dx) and Mv(dy) of the center position of the suction nozzle 25 moved to an arbitrary position as in the figure G2, further using the amount of X-direction displacement Xdx and the amount of Y-direction displacement Xdy of the suction nozzle 25 based on the center position of the main camera 23.

In other words, when a command to mount the electronic component 2 on the coordinates (Xu1, Yu1) of the printed board 1 is performed, even if the head unit 20 and the suction nozzle 25 are moved to these coordinates (theoretical position coordinates) on the control program in a case where this arithmetic processing is not performed, the suction nozzle 25 is actually moved to the actual position coordinates (Xu2, Yu2). When the head unit 20 is moved, therefore, this arithmetic processing is performed to perform control of correcting the number of rotations of the servomotor 32 while taking the amount of movement Mv(dx) in the direction X of the suction nozzle 25 into consideration and control of correcting the number of rotations of the servomotor 42 while taking the amount of movement Mv(dy) in the direction Y of the suction nozzle 25 into consideration. Thus, even if the posture of the head unit 20 in motion sways from side to side due to the distortion of the guide rail 33, the center position of the suction nozzle 25 can be accurately moved toward the theoretical position coordinates (Xu1, Yu1) on the control program.

According to the first embodiment, the aforementioned control of correcting the center position (arithmetic processing for calculating the correction amounts by the central processing unit 71) is performed individually with respect to each of the six suction nozzles 25 provided on the head unit 20. Therefore, the electronic component 2 is mounted in a state where the center position of the suction nozzle 25 suctioning the electronic component 2 is corrected even if any of the six suction nozzles 25 is used to mount the electronic component 2.

According to the first embodiment, data (correction tables 5a and 5b) to be used as a reference for calculating the amount of Y-direction displacement Xdy(M) of the center position of the main camera 23 and the amount of Y-direction displacement Xdy(S) of the center position of the auxiliary camera 24 used to calculate the horizontal rotation angle θ, expressed in the expression 3 is previously acquired by the following measurement method. The correction tables 5a and 5b are examples of the "first correction table" and the "second correction table" in the present invention, respectively.

Specifically, the correction amounts (amounts of displacement) serving as reference data for correcting distortion existing in the support portion 30 (X-axis) and the moving mechanism 40 (Y-axis) of the surface mounter 100 are measured with a jig plate 105 made of glass, shown in FIG. 6. On a surface of this jig plate 105, a plurality of (P×Q) reference marks R ($R_{11}$ to $R_{PQ}$) are printed in a lattice pattern along directions (X-axis and Y-axis directions) orthogonal to each other. In place of the printed board 1, the jig plate 105 is placed on the conveyor portions 11 and is fixed to a prescribed position. Thereafter, the head unit 20 is moved, and the individual reference marks R are successively imaged.

According to the first embodiment, the main camera 23 (see FIG. 4) of the head unit 20 is first used to image the individual reference marks R, and the amounts of displacement of the reference marks R imaged at respective positions from the theoretical positions are obtained. By way of example, the support portion 30 (X-axis) and the moving mechanism 40 (Y-axis) are driven to move the center of the main camera 23 to the coordinates (1, 1) on the control program, for example. In this case, if the center position coordinates (1, 1) in the imaging field of view of the main camera 23 and a reference mark $R_{11}$ applied to actual coordinates ($X_{11}$, $Y_{11}$) in the jig plate 105 do not completely overlap with each other, the correction amounts (amounts of displacement) of the actual coordinates ($X_{11}$, $Y_{11}$) with respect to the theoretical coordinates (1, 1) are obtained as ($\Delta X_{11}$, $\Delta Y_{11}$) on the basis of an image processing result after imaging. This calculation of the correction amounts is sequentially performed from the reference mark $R_{11}$ (actual coordinates ($X_{11}$, $Y_{11}$)) to a reference mark $R_{P1}$ (actual coordinates ($X_{1P}$, $Y_{1P}$)) along the guide rail 33 by driving the support portion 30 in the direction X. After the center position of the main camera 23 is returned to the reference point (original point), the calculation of the correction amounts is sequentially performed from a reference mark $R_{12}$ (actual coordinates ($X_{21}$, $Y_{21}$)) to a reference mark $R_{1Q}$ (actual coordinates ($X_{Q1}$, $Y_{Q1}$)) along the guide rail 43 by driving the moving mechanism 40 in the direction Y while fixing the support portion 30. In other words, the correction amounts (ΔX, ΔY) are calculated with respect to each of reference marks R existing in an L-shaped area 106 surrounded by a broken line in FIG. 6. Consequently, the correction table 5a shown in an upper region of FIG. 7 is obtained.

Through a procedure similar to the above, the correction amounts (ΔX, ΔY) with respect to the auxiliary camera 24 (see FIG. 4) are calculated. In this case, the jig plate 105 temporarily fixed to the conveyor portions 11 is moved by a center-to-center distance Xc (=|Xs−Xm|) (see FIG. 5) between the main camera 23 and the auxiliary camera 24 along arrow X1 and is refixed to the conveyor portions 11, whereby the jig plate 105 is set to a position for the auxiliary camera 24. Then, the correction amounts (ΔX, ΔY) are calculated with respect to each of the reference marks $R_{11}$ to $R_{P1}$ and the reference marks $R_{12}$ to $R_{1Q}$ while the reference marks $R_{11}$ to $R_{P1}$ aligned in the direction X and the reference marks $R_{12}$ to $R_{1Q}$ aligned in the direction Y are successively imaged with the auxiliary camera 24. Consequently, the correction table 5b shown in a lower region of FIG. 7 is obtained. The correction tables 5a and 5b are stored in the correction data storage portion 72b (see FIG. 3) of the storage portion 72. In this manner, basic data to obtain the aforementioned amounts of Y-direction displacement Xdy (M) and Xdy(S) used to calculate the horizontal rotation angle θ is previously acquired.

Therefore, by way of example, when the electronic component 2 is mounted on the coordinates (Xu1, Yu1) of the printed board 1, the central processing unit 71 extracts the correction amounts (ΔX, ΔY) corresponding to a reference mark $R_{pq}$ nearest to the center position coordinates (Xm, Ym) of the main camera 23 while referring to the correction table 5a and extracts the correction amounts (ΔX, ΔY) of the auxiliary camera 24 separated by the distance Xc from the main camera 23 while referring to the correction table 5b. As to the correction amounts (ΔX, ΔY), only data regarding the reference marks R in the L-shaped area 106 surrounded by a broken line in FIG. 6 is stored in the correction table 5a (5b), as described above. Thus, according to the first embodiment, the X-component $\Delta X_{1p}$ of the correction amount of a reference mark $R_{p1}$ and the Y-component $\Delta Y_{q1}$ of the correction amount of a reference mark $R_{1q}$ are used for the correction amounts (ΔX, ΔY) with respect to the reference mark $R_{pq}$ nearest to the center position coordinates (Xm, Ym). In other words, the processing is performed by substituting the components ($\Delta X_{1p}$, $\Delta Y_{q1}$) for the correction amounts (ΔX, ΔY) with respect to the reference mark $R_{pq}$. This is because the amounts of displacement of the main camera 23 (or the auxiliary camera 24) due to the distortion of the guide rail 33 constituting the X-axis are the same no matter to which position on the guide rail 43 the moving mechanism 40 responsible for Y-axis movement is fixed, so that it is not necessary to measure the correction amounts (amounts of displacement) with respect to all the reference marks R (P×Q in total) in the jig plate 105. Thus, the capacity of the correction data storage portion 72b is also saved.

When the correction amounts ($\Delta X_{1p}$, $\Delta Y_{q1}$) corresponding to the reference mark $R_{pq}$ nearest to the center position coordinates (Xm, Ym) of the main camera 23 (see FIG. 4) are extracted by the aforementioned method, the coordinates of this reference mark $R_{pq}$ and the coordinates (Xm, Ym) of the main camera 23 do not strictly coincide with each other. Therefore, the strict correction amounts (ΔX, ΔY) corresponding to the coordinates (Xm, Ym) are calculated by interpolating the respective correction amounts corresponding to a reference mark $R_{(p+1, q)}$ next to the nearest reference mark $R_{pq}$ in the direction X and a reference mark $R_{(p, q+1)}$ next to the nearest reference mark $R_{pq}$ in the direction Y, as shown in FIG. 6.

The method for obtaining the correction amounts of an arbitrary position by interpolating this existing data of the correction table 5a is similarly applied also when the correction amounts (ΔX (=amount of X-direction displacement Xdx) and ΔY (=amount of Y-direction displacement Xdy)) corresponding to the center position (Xu1, Yu1) of the suction nozzle 25 are derived. Furthermore, the similar method is applied also when the correction amounts (amounts of displacement) acquired regarding the auxiliary camera 24 (see FIG. 4) are calculated.

According to the first embodiment, the central processing unit 71 refers to the correction tables 5a and 5b (see FIG. 7) in the arithmetic processing to calculate the horizontal rotation angle θ regarding the rotational movement of the head unit 20 by the expression 3 on the basis of ΔY (=Xdy(M)) of the main camera 23 and ΔY (=Xdy(S)) of the auxiliary camera 24 and obtain the amounts of rotation-induced displacement Udx and Udy from the expressions 4 and 5 with the horizontal rotation angle θ, respectively. Furthermore, the central processing unit 71 obtains the amount of X-direction displacement Xdx at the position corresponding to the X-coordinate (Xu1) of the suction nozzle 25 and the amount of Y-direction displacement Xdy at the position corresponding to the Y-coordinate (Yu1) of the suction nozzle 25 on the basis of the correction table 5a. In addition, the central processing unit 71 calculates the final amount of movement Mv(dx) expressed by the expression 1 and the final amount of movement Mv(dy) expressed by the expression 2. The servomotor 32 (see FIG. 3) is immediately rotated while this arithmetic processing and the amount of movement Mv(dx) in the direction X of the suction nozzle 25 are taken into consideration, and the servomotor 42 (see FIG. 3) is rotated while this arithmetic processing and the amount of movement Mv(dy) in the direction Y of the suction nozzle 25 are taken into consideration. Thus, the suction nozzle 25 is accurately moved toward the coordinates (Xu1, Yu1) on the control program without displacement.

Each of the suction nozzles 25 is configured to be movable in the vertical direction (direction Z) with respect to the head unit 20 by a servomotor 26 (see FIG. 3) and an unshown elevating mechanism. In the surface mounter 100, the suction nozzles 25 suction the electronic components 2 (see FIG. 2) from the tape feeders 3 (see FIG. 1) in a state where the same are lowered to move-down positions by the head unit 20, are returned to move-up positions in a state where the same suction the electronic components 2, are conveyed to prescribed positions on the printed board 1 (see FIG. 1), are lowered again at the prescribed positions, and mount the electronic components 2 on the printed board 1. Furthermore, each of the suction nozzles 25 is configured to be rotated in the X-Y plane about a nozzle axis (Z-axis) by a servomotor 27 (see FIG. 3) and an unshown rotating mechanism. Thus, the postures (orientations in the X-Y plane) of the electronic components 2 held by forward end portions of the suction nozzles 25 are finely adjusted.

On the upper surface 4a of the base 4, a board camera 50 and a component camera 60 are fixedly set. The component camera 60 has a function of imaging the lower surface sides of the electronic components 2 suctioned by the suction nozzles 25 from below. Thus, whether the shapes of the electronic components 2 are good or not is determined, and whether the suction positions of the suction nozzles 25 with respect to the electronic components 2 are good or not is determined.

As shown in FIG. 3, the operation of the surface mounter 100 is controlled by the controller 70. The central processing unit 71 generally controls the operation of the surface mounter 100. Control programs capable of being executed by the central processing unit 71, data required to move the head unit 20, etc. are stored in the operating program storage portion 72a of the storage portion 72. Furthermore, the aforementioned correction tables 5a and 5b are stored in the correction data storage portion 72b. The image processing portion 73 has a function of internally generating data required for the operation of the surface mounter 100 by processing image data imaged by the main camera 23 and the auxiliary camera 24 in addition to the board camera 50.

The motor control portion 74 is configured to control the servomotors (the servomotor 42 (see FIG. 1) moving the support portion 30 in the direction Y, the servomotor 32 (see FIG. 1) moving the head unit 20 in the direction X, the servomotor 26 moving the suction nozzles 25 in the vertical direction, the servomotor 27 rotating the suction nozzles 25 about the nozzle axes, etc.) of the surface mounter 100 on the basis of control signals output from the central processing unit 71. Furthermore, the motor control portion 74 is configured to control a servomotor of a board conveyance axis (not shown) provided in the board conveying portion 10. In addition, the motor control portion 74 is configured to be capable of recognizing the position of the head unit 20 in the X-Y plane, the height positions and rotation positions of the suction nozzles 25, etc. on the basis of signals from encoders (not shown) of the servomotors. The external input/output portion 75 has a function of controlling input/output from various operating buttons 76 including an operation start button and various sensors 77 such as the board sensors. In this manner, the surface mounter 100 is configured.

Next, the flow of control processing performed by the central processing unit 71 to acquire the correction amounts (amounts of displacement) serving as reference data for correcting the distortion of the surface mounter 100 with the main camera 23 and the auxiliary camera 24 is described with reference to FIGS. 1, 3, and 5 to 8. Before this flow of control processing is started, the user places the jig plate 105 on the conveyor portions 11 (see FIG. 1) and fixes the jig plate 105 to the prescribed position. Therefore, the operation of the surface mounter 100 (see FIG. 1) after fixing of the jig plate 105 (see FIG. 6) to the conveyor portions 11 is described below. As a typical example, the operation of the surface mounter 100 for obtaining the correction amounts (amounts of displacement) with the main camera 23 (see FIG. 1) is described.

At a step S1, the central processing unit 71 (see FIG. 3) initializes a variable (counter) for counting the number of times of imaging by the main camera 23 (see FIG. 3), as shown in FIG. 8. In other words, the counter is set to p=1 and q=1. At a step S2, on the basis of a command of the central processing unit 71, the servomotor 32 (see FIG. 3) is driven to move the center position (center point of the imaging field of view) of the main camera 23 of the head unit 20 (see FIG. 1) to the theoretical coordinates (1, 1) on the control program. At a step S3, the main camera 23 images the reference mark $R_{11}$ applied to the actual coordinates $(X_{11}, Y_{11})$ in a first row on the jig plate 105 (see FIG. 6) fixed to the conveyor portions 11 (see FIG. 1) while the center of the main camera 23 stops at the theoretical coordinates (1, 1).

At a step S4, the central processing unit 71 calculates the correction amounts (amounts of displacement) of the actual coordinates $(X_{11}, Y_{11})$ with respect to the theoretical coordinates (1, 1) as $(\Delta X_{11}, \Delta Y_{11})$ on the basis of the image processing result after imaging by the main camera 23.

At a step S5, the central processing unit 71 determines whether or not imaging of all the reference marks R ($R_{11}$ to $R_{P1}$) in the first row (in the direction X) is completed. If determining that imaging of all the reference marks R ($R_{11}$ to $R_{P1}$) in the first row is not completed at the step S5 ("no" determination), the central processing unit 71 increments p by one (p=p+1) at a step S6. Then, the central processing unit 71 returns to the step S2, and repeats the same processing described above. In other words, at the steps S2 to S6, the center position of the main camera 23 is transversely moved from the theoretical coordinates (1, 1) to coordinates (2, 1), a reference mark $R_{21}$ (see FIG. 6) of a corresponding actual coordinates $(X_{12}, Y_{12})$ in the first row is imaged, and the correction amounts $(\Delta X_{12}, \Delta Y_{12})$ are calculated on the basis of the image processing. Thereafter, p is incremented by one, the center of the main camera 23 is transversely moved from the theoretical coordinates (2, 1) to coordinates (3, 1), a reference mark $R_{31}$ (see FIG. 6) of a corresponding actual coordinates $(X_{13}, Y_{13})$ in the first row is imaged, and the correction amounts $(\Delta X_{13}, \Delta Y_{13})$ are calculated on the basis of the image processing. These operations are repeated until p=P. The calculated correction amounts $(\Delta X, \Delta Y)$ corresponding to actual coordinates in the first row are temporarily stored in a working memory area of the storage portion 72 (see FIG. 3) each time.

If determining that imaging of all the reference marks R ($R_{11}$ to $R_{P1}$) in the first row (in the direction X) is completed at the step S5 ("yes" determination), the central processing unit 71 determines whether or not imaging of all the reference marks R ($R_{12}$ to $R_{1Q}$) in a first column (in the direction Y) is completed at a step S7. If determining that imaging of all the reference marks R ($R_{12}$ to $R_{1Q}$) in the first column is not completed at the step S7 ("no" determination), the central processing unit 71 sets p=1 as a fixed value and increments q by one (q=q+1) at a step S8. Then, the central processing unit 71 returns to the step S2, and repeats the same processing described above. In other words, at the steps S2 to S8 (except the step S6), the center of the main camera 23 is moved from a theoretical coordinates (P, 1) to coordinates (1, 2), the reference mark $R_{12}$ (see FIG. 6) of the corresponding actual coordinates $(X_{21}, Y_{21})$ in the first column is imaged, and the correction amounts $(\Delta X_{21}, \Delta Y_{21})$ are calculated on the basis of the image processing. Thereafter, q is incremented by one, the center of the main camera 23 is moved from the theoretical coordinates (1, 2) to coordinates (1, 3), a reference mark $R_{13}$ (see FIG. 6) of a corresponding actual coordinates $(X_{31}, Y_{31})$ in the first column is imaged, and the correction amounts $(\Delta X_{31}, \Delta Y_{31})$ are calculated on the basis of the image processing. These operations are repeated until q=Q (p=1 is a fixed value). The calculated correction amounts $(\Delta X, \Delta Y)$ corresponding to actual coordinates in the first column are temporarily stored in the working memory area of the storage portion 72 each time.

If determining that imaging of all the reference marks R ($R_{12}$ to $R_{1Q}$) in the first column (in the direction Y) is completed at the step S7 ("yes" determination), the central processing unit 71 prepares the correction table 5a (see FIG. 7) while referring to the correction amounts $(\Delta X, \Delta Y)$ corresponding to the actual coordinates stored in the working memory area of the storage portion 72, and stores the correction table 5a in the correction data storage portion 72b (see FIG. 3) at a step S9. In this manner, the central processing unit 71 acquires the respective correction amounts $(\Delta X, \Delta Y)$ regarding the reference marks R in the L-shaped area 106 surrounded by a broken line in FIG. 6, and terminates this control processing.

The aforementioned flow of this control processing is also applied to the operation of the auxiliary camera 24 (see FIG. 3) for obtaining the correction amounts (amounts of displacement), similarly. In this case, the user moves the jig plate 105 (see FIG. 6) temporarily fixed to the conveyor portions 11 (see FIG. 1) by the center-to-center distance Xc (=|Xs−Xm|) (see FIG. 5) between the main camera 23 and the auxiliary camera 24 along arrow X1 and refixes the jig plate 105 to the conveyor portions 11 thereby setting the jig plate 105 to the position for the auxiliary camera 24. Then, the flow of this control processing is performed, and the correction table 5b (see FIG. 7) is prepared and is stored in the correction data storage portion 72b (see FIG. 3). In this manner, basic data of the correction amounts (amounts of displacement) for correcting the distortion of the surface mounter 100 is acquired with the main camera 23 and the auxiliary camera 24.

Next, the flow of control processing performed by the central processing unit 71 to mount the electronic components 2 on the printed board 1 is described with reference to FIGS. 2, 3, 5 to 7, and 9.

At a step S21, the central processing unit 71 (see FIG. 3) reads the mounting position coordinates ((Xu1, Yu1), for example (see FIG. 5)) of a first electronic component 2 (see FIG. 2) included in data on component mounting, as shown in FIG. 9.

At a step S22, the central processing unit 71 calculates the correction amounts (amounts of movement Mv(dx) and Mv(dy)) for moving the head unit 20 on the basis of the correction tables 5*a* and 5*b* (see FIG. 7).

Specifically, the central processing unit 71 extracts the correction amounts ($\Delta X_{1p}$, $\Delta Y_{q1}$) calculated with respect to the reference mark $R_{pq}$ (see FIG. 6) nearest to the center position coordinates (Xm, Ym) of the main camera 23 from the correction table 5*a*, and extracts the correction amounts ($\Delta X_{1p}$, $\Delta Y_{q+1, 1}$) corresponding to the reference mark $R_{(p, q+1)}$ next to the nearest reference mark $R_{pq}$ along arrow Y1. Then, the central processing unit 71 calculates the correction amount $\Delta Y$ (=Xdy(M)) corresponding to the coordinate Ym by interpolating the correction amounts. Similarly, the central processing unit 71 extracts the correction amounts ($\Delta X_{1p}$, $\Delta Y_{q1}$) calculated with respect to the reference mark $R_{pq}$ nearest to the center position coordinates (Xs, Ym) of the auxiliary camera 24 from the correction table 5*b*, and extracts the correction amounts ($\Delta X_{1p}$, $\Delta Y_{q+1, 1}$) corresponding to the reference mark $R_{p, q+1}$ next to the nearest reference mark $R_{pq}$ along arrow Y1. Then, the central processing unit 71 calculates the correction amount $\Delta Y$ (=Xdy(S)) corresponding to the coordinate Ym regarding the auxiliary camera 24 by interpolating the correction amounts.

Then, the central processing unit 71 calculates the horizontal rotation angle θ regarding the rotational movement of the head unit 20 from the expression 3 on the basis of the correction amount (amount of displacement) $\Delta Y$ (=Xdy(M)) of the main camera 23 and the correction amount (amount of displacement) $\Delta Y$ (=Xdy(S)) of the auxiliary camera 24, and calculates the amounts of rotation-induced displacement Udx and Udy from the expressions 4 and 5, respectively, on the basis of the horizontal rotation angle θ.

Furthermore, the central processing unit 71 calculates the correction amount $\Delta X$ (=amount of X-direction displacement Xdx) and the correction amount $\Delta Y$ (=amount of Y-direction displacement Xdy) corresponding to the center position (Xu1, Yu1) of the suction nozzle 25 from the correction table 5*a* by the similar method (interpolation method), similarly to a case of obtaining the aforementioned correction amount $\Delta Y$ (=Xdy(M)). When the reference mark nearest to the center position (Xu1, Yu1) is $R_{pq}$, for example, the central processing unit 71 calculates the correction amounts ($\Delta X$ (=Xdx), $\Delta Y$ (=Xdy)) corresponding to the coordinates (Xu1, Yu1) by interpolating the respective correction amounts corresponding to the reference mark $R_{(p+1, q)}$ next to the reference mark $R_{pq}$ along arrow X1 and the reference mark $R_{(p, q+1)}$ next to the reference mark $R_{pq}$ along arrow Y1. Then, the central processing unit 71 calculates the final correction amount (amount of movement Mv(dx) (=Xdx+Udx)) on the basis of the expression 1 and the final correction amount (amount of movement Mv(dy) (=Xdy+Udy)) on the basis of the expression 2. At the step S22, the central processing unit 71 performs this arithmetic processing.

At a step S23, the central processing unit 71 moves the head unit 20 to the mounting position while taking the correction amounts (amounts of movement Mv(dx) and Mv(dy)) obtained at the step S22 into consideration. In other words, the central processing unit 71 rotates the servomotor 32 (see FIG. 3) while taking the amount of movement Mv(dx) in the direction X of the suction nozzle 25 into consideration and rotates the servomotor 42 (see FIG. 3) while taking the amount of movement Mv(dy) in the direction Y of the suction nozzle 25 into consideration. At a step S24, the central processing unit 71 mounts the electronic component 2 (see FIG. 2) on the printed board 1 (see FIG. 2) in the head unit 20 in the state moved to the mounting position.

At a step S25, the central processing unit 71 determines whether or not unimplemented data on component mounting remains. If determining that the data on component mounting remains at the step S25 ("yes" determination), the central processing unit 71 returns to the step S21, and repeats the same processing described above. In other words, the central processing unit 71 reads the mounting position coordinates (Xu1, Yu1) of an electronic component 2 to be newly mounted, and calculates the correction amounts (amounts of movement Mv(dx) and Mv(dy)) regarding this electronic component 2 on the basis of the correction tables 5*a* and 5*b* (see FIG. 7). Then, the central processing unit 71 rotates the servomotor 32 (see FIG. 3) while taking the amount of movement Mv(dx) in the direction X of the suction nozzle 25 into consideration and rotates the servomotor 42 (see FIG. 3) while taking the amount of movement Mv(dy) in the direction Y of the suction nozzle 25 into consideration, and mounting of the electronic component 2 on the printed board 1 is repeated for each mounting operation. If determining that there is no unimplemented data on component mounting (mounting of all the electronic components 2 is completed) at the step S25 ("no" determination), the central processing unit 71 terminates this control processing.

According to the first embodiment, as hereinabove described, the central processing unit 71 is configured to perform control of calculating the horizontal rotation angle θ of the head unit 20 in the X-Y plane from the displacement of the center of the main camera 23 and the displacement of the center of the auxiliary camera 24 and correcting the center position of the suction nozzle 25 on the basis of the amounts of rotation-induced displacement Udx and Udy of the center of the suction nozzle 25 due to the horizontal rotation angle θ and the amount of X-direction displacement Xdx and the amount of Y-direction displacement Xdy in the X-Y plane that are not induced by the rotation of the center of the suction nozzle 25 when moving the head unit 20. Thus, the central processing unit 71 can properly correct the center position of the suction nozzle 25 with the horizontal rotation angle θ of the head unit 20 and the amount of X-direction displacement Xdx and the amount of Y-direction displacement Xdy that are not induced by the rotation when moving the head unit 20 even if the head unit 20 in which the suction nozzles 25 are not arranged on the straight line 500 passing through the center of the main camera 23 and the center of the auxiliary camera 24 (the suction nozzles 25 are spaced by the distance L3 along arrow Y1 from the straight line 500) is used. Thus, the central processing unit 71 can accurately move the suction nozzle 25 to the mounting position on the printed board 1.

According to the first embodiment, the main camera 23 and the auxiliary camera 24 are aligned in the direction X, and the amount of X-direction displacement Xdx and the amount of Y-direction displacement Xdy of the suction nozzle 25 include only the components based on the displacement of the center position of the main camera 23 (or the auxiliary camera 24) from the theoretical position coordinates thereof. Furthermore, the central processing unit 71 is configured to perform control of correcting the center position of the suction nozzle 25 on the basis of the amounts of rotation-induced displacement Udx and Udy of the center of the suction nozzle 25, the horizontal rotation angle θ of the head unit 20, and the amount of X-direction displacement Xdx and the amount of Y-direction displacement Xdy that are not induced by the rotation. Thus, the central processing unit 71 can properly correct the center position of the suction nozzle 25 when moving the head unit 20 in which the main camera 23 and the auxiliary camera 24 are aligned in the direction X.

According to the first embodiment, the central processing unit 71 is configured to perform control of correcting the center position of the suction nozzle 25 and moving the head unit 20 on the basis of the horizontal rotation angle θ of the head unit 20 in the horizontal plane (X-Y plane), the amounts of rotation-induced displacement Udx and Udy, and the amount of X-direction displacement Xdx (component Ydx=0) and the amount of Y-direction displacement Xdy (component Ydy=0) that are not induced by the rotation of the center of the suction nozzle 25, when a component mounting operation for mounting the electronic component 2 on the printed board 1 is performed with the head unit. Thus, it is only necessary for the central processing unit 71 to calculate the amounts of movement Mv(dx) and Mv(dy) serving as the correction amounts of the center position of the suction nozzle 25 each time the component mounting operation is performed. Therefore, as compared with a case where correction amounts (amounts of movement Mv(dx) and Mv(dy)) regarding a large number of mounting positions are obtained in a matrix manner to cover an entire region in the X-Y plane and are stored as data in the surface mounter 100, for example, it is not necessary to hold a large amount of data, so that the amount of data held in the surface mounter 100 can be significantly reduced.

According to the first embodiment, the central processing unit 71 is configured to perform control of correcting the center position of the suction nozzle 25 and moving the head unit 20 on the basis of the horizontal rotation angle θ of the head unit 20 in the X-Y plane, the amounts of rotation-induced displacement Udx and Udy, and the amount of X-direction displacement Xdx and the amount of Y-direction displacement Xdy that are not induced by the rotation of the center of the suction nozzle 25, each time a single mounting operation on each of the electronic components 2 is performed. Thus, the control of correcting the center position of the suction nozzle 25 and moving the head unit 20 is performed once in every operation for mounting the individual electronic components 2, and hence the suction nozzle 25 can be accurately moved to the corresponding mounting position each time a mounting operation is performed on each of the electronic components 2 at a different mounting position.

According to the first embodiment, the central processing unit 71 is configured to perform the arithmetic processing for correcting the center position of the suction nozzle 25 and perform control of moving the head unit 20 on the basis of the horizontal rotation angle θ, the amounts of rotation-induced displacement Udx and Udy, and the amount of X-direction displacement Xdx and the amount of Y-direction displacement Xdy. Thus, the head unit 20 can be moved actually while the arithmetic processing for correcting the center position of the suction nozzle 25 is performed, and hence the takt time required for a mounting operation on each of the electronic components 2 can be inhibited from increasing due to the arithmetic processing.

According to the first embodiment, the amount of rotation-induced displacement Udx in the direction X of the center position of the suction nozzle 25 is calculated on the basis of the horizontal rotation angle θ and the relative positions Xuo and Yuo of the center position of the suction nozzle 25 in the directions X and Y with respect to the center position of the main camera 23, and the amount of rotation-induced displacement Udy in the direction Y of the center position of the suction nozzle 25 is calculated on the basis of the horizontal rotation angle θ and the relative positions Xuo and Yuo of the center position of the suction nozzle 25 in the directions X and Y with respect to the center position of the main camera 23. Furthermore, the central processing unit 71 is configured to perform control of correcting the center position of the suction nozzle 25 on the basis of the correction amount (amount of movement Mv(dx)) in the direction X of the center position of the suction nozzle 25 based on the amount of rotation-induced displacement Udx and the amount of X-direction displacement Xdx and the correction amount (amount of movement Mv(dy)) in the direction Y of the center position of the suction nozzle 25 based on the amount of rotation-induced displacement Udy and the amount of Y-direction displacement Xdy. Thus, the amounts of rotation-induced displacement Udx and Udy can be easily grasped on the basis of the positional relation between the center position of the suction nozzle 25 and the center position of the main camera 23 in the head unit 20 (the relative positions Xuo and Yuo of the suction nozzle 25 in the directions X and Y with respect to the main camera 23), and the amount of movement Mv(dx) in the direction X and the amount of movement Mv(dy) in the direction Y of the center position of the suction nozzle 25 in the head unit 20 in motion can be accurately obtained on the basis of the amounts of rotation-induced displacement Udx and Udy induced by rotational movement and the amount of X-direction displacement Xdx and the amount of Y-direction displacement Xdy that are not induced by the rotation of the center of the suction nozzle 25.

According to the first embodiment, the amount of movement Mv(dx) is obtained as a sum of the amount of rotation-induced displacement Udx and the amount of X-direction displacement Xdx, as shown in the expression 1, and the amount of movement Mv(dy) is obtained as a sum of the amount of rotation-induced displacement Udy and the amount of Y-direction displacement Xdy, as shown in the expression 2. Thus, the central processing unit 71 can easily calculate the correction amount (amount of movement Mv(dx)) in the direction X and the correction amount (amount of movement Mv(dy)) in the direction Y of the center position of the suction nozzle 25.

According to the first embodiment, the central processing unit 71 is configured to perform control of moving the center position of the suction nozzle 25 to position coordinates obtained by subtracting the amount of movement Mv(dx) in the direction X and the amount of movement Mv(dy) in the direction Y from the theoretical position coordinates of the center position of the suction nozzle 25, respectively, when moving the head unit 20. Thus, the center position of the suction nozzle 25 can be easily corrected with the amount of movement Mv(dx) and the amount of movement Mv(dy) in the arithmetic processing performed by the central processing unit 71, and hence the suction nozzle 25 can be easily moved to a working position after correction.

According to the first embodiment, the surface mounter 100 includes the correction tables 5a and 5b to which the central processing unit 71 refers for the amounts of displacement of the respective actual position coordinates with respect to the respective theoretical position coordinates of the center of the main camera 23 and the center of the auxiliary camera 24 when moving the head unit 20 in the X-Y plane. Furthermore, the central processing unit 71 is configured to perform control of calculating the horizontal rotation angle θ from the displacement of the center of the main camera 23 and the displacement of the center of the auxiliary camera 24 grasped on the basis of the correction tables 5a and 5b and correcting the center position of the suction nozzle 25 on the basis of the amounts of rotation-induced displacement Udx and Udy of the center of the suction nozzle 25 due to the horizontal rotation angle θ and the amount of X-direction displacement Xdx and the amount of Y-direction displacement Xdy that are not induced by the rotation of the center of the suction nozzle 25 when moving the head unit 20. Thus, the arithmetic processing for correcting the center position of the suction nozzle 25 can be promptly performed on the basis of the horizontal rotation angle θ, the amounts of rotation-induced displacement Udx and Udy, and the amounts of X-direction displacement Xdx and Y-direction displacement Xdy, effectively utilizing the correction tables 5a and 5b.

According to the first embodiment, the correction table 5a in which the amounts of displacement of the actual position coordinates with respect to the theoretical position coordinates of the center of the main camera 23 are defined and the correction table 5b in which the amounts of displacement of the actual position coordinates with respect to the theoretical position coordinates of the center of the auxiliary camera 24 are defined are stored in the correction data storage portion 72b. Furthermore, the amounts of rotation-induced displacement Udx and Udy are calculated with the correction tables 5a and 5b, and the amount of X-direction displacement Xdx and the amount of Y-direction displacement Xdy are calculated with the correction table 5a of the main camera 23. Thus, the amounts of rotation-induced displacement Udx and Udy of the center of the suction nozzle 25 can be easily calculated with the correction tables 5a and 5b, and the amount of X-direction displacement Xdx and the amount of Y-direction displacement Xdy that are not induced by the rotation of the center of the suction nozzle 25 can be easily calculated, effectively utilizing the correction table 5a.

According to the first embodiment, the surface mounter 100 includes the support portion 30 so configured that the head unit 20 is movable in the X-Y plane, and the support portion 30 has the guide rail 33 extending in the direction X to move the head unit 20 along the direction X. Furthermore, the central processing unit 71 is configured to perform control of calculating the horizontal rotation angle θ of the head unit 20 from the displacement of the center of the main camera 23 and the displacement of the center of the auxiliary camera 24 resulting from the distortion of the guide rail 33 and correcting the center position of the suction nozzle 25 on the basis of the amounts of rotation-induced displacement Udx and Udy of the center of the suction nozzle 25 due to the horizontal rotation angle θ and the amount of X-direction displacement Xdx and the amount of Y-direction displacement Xdy that are not induced by the rotation of the center of the suction nozzle 25 when moving the head unit 20 in the direction X by the support portion 30. Thus, even if the guide rail 33 of the support portion 30 extending in the direction X is deformed such as undulated in the direction Y, the center position of the suction nozzle 25 can be properly corrected with the amounts of rotation-induced displacement Udx and Udy of the center of the suction nozzle 25 resulting from the rotation of the head unit 20 due to the distortion of the guide rail 33 and the amount of X-direction displacement Xdx and the amount of Y-direction displacement Xdy that are not induced by the rotation when the head unit 20 is moved.

According to the first embodiment, the six suction nozzles 25 are provided on the head unit 20, and the central processing unit 71 is configured to perform control of calculating the horizontal rotation angle θ of the head unit 20 in the X-Y plane from the displacement of the center of the main camera 23 and the displacement of the center of the auxiliary camera 24 for each of the six suction nozzles 25 and individually correcting the center positions of the six suction nozzles 25 on the basis of the amounts of rotation-induced displacement Udx and Udy of the centers of the suction nozzles 25 due to the horizontal rotation angles θ and the amounts of X-direction displacement Xdx and the amounts of Y-direction displacement Xdy that are not induced by the rotation of the centers of the suction nozzles 25 when moving the head unit 20. Thus, also when the head unit 20 has the plurality of suction nozzles 25, the central processing unit 71 performs control of correcting the respective center positions of the suction nozzles 25 and moving the head unit 20, so that the suction nozzles 25 corresponding to the respective mounting positions can be accurately moved with respect to all component mounting operations performed with this head unit 20.

(Second Embodiment)

A second embodiment is now described with reference to FIGS. 5, 7, 10, and 11. In a surface mounter 200 according to the second embodiment of the present invention, a head unit 220 is so configured that the distance L1 (in a direction Y) of a main camera 223 from a ball screw shaft 31 (X-axis) and the distance L2 of an auxiliary camera 224 from the ball screw shaft 31 are different from each other (L1<L2), as shown in FIG. 10. Therefore, a method for calculating the positional displacement correction value of a suction nozzle 25 on the basis of position measurement of the main camera 223 and the auxiliary camera 224 is different from the method according to the first embodiment. In the drawings, portions identical to those of the aforementioned first embodiment are shown by the same reference numerals.

Figure 11:
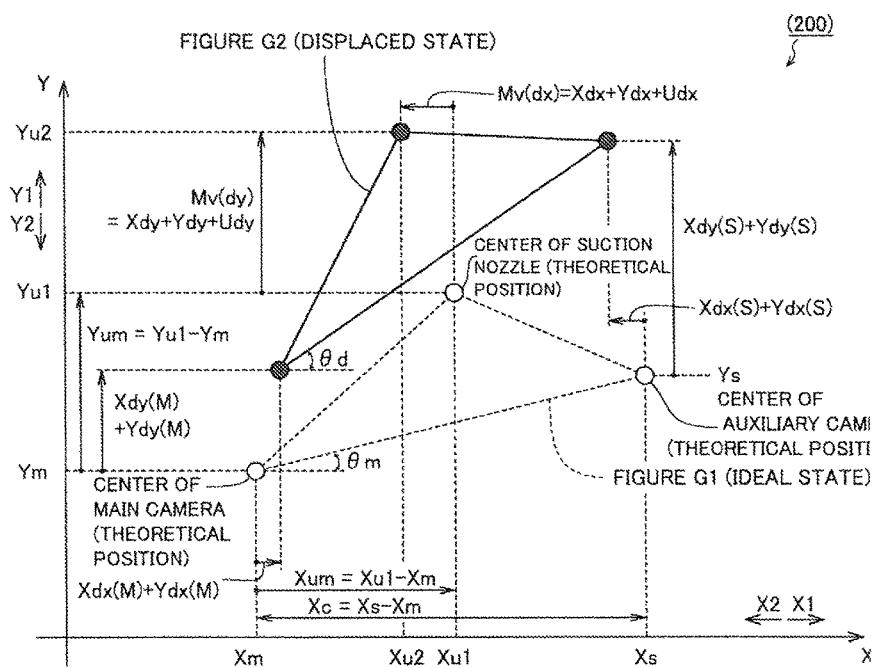
FIG. 11 illustrates a method for calculating the amounts of displacement (correction amounts) of a suction nozzle from the theoretical position coordinates thereof associated with the displacement of the head unit in the surface mounter according to the second embodiment of the present invention.

In the head unit 220, the main camera 223 and the auxiliary camera 224 are positionally displaced in the direction Y, as shown in FIG. 10. Therefore, in operations performed by a central processing unit 71 in the second embodiment, the amount of X-direction displacement of the suction nozzle 25 (see FIG. 10) induced by the displacement of the center position of the main camera 223 from the theoretical center position thereof (the amount of X-direction displacement at a position corresponding to the X-coordinate (Xu1) of the suction nozzle 25) is replaced with "Xdx+Ydx", and the amount of Y-direction displacement of the suction nozzle 25 (the amount of Y-direction displacement at a position corresponding to the Y-coordinate (Yu1) of the suction nozzle 25) is replaced with "Xdy+Ydy", as shown in FIG. 11. Arithmetic processing substantially similar to the arithmetic processing in the first embodiment is applied to calculate the amount of movement Mv(dx) in a direction X of the center position of the suction nozzle 25 and the amount of movement Mv(dy) in the direction Y of the center position of the suction nozzle 25. The amount of X-direction displacement Xdx+Ydx and the amount of Y-direction displacement Xdy+Ydy are examples of the "first amount of displacement" and the "second amount of displacement" in the present invention, respectively. A method for obtaining parameters used in the second embodiment is hereinafter described.

First, if there is no distortion (undulation) in a guide rail 33 (see FIG. 10) ideally, there is the positional relation of intersecting at an angle θm between a straight line 520 (see FIG. 10) connecting the main camera 223 (see FIG. 10) and the auxiliary camera 224 (see FIG. 10) of the head unit 220 (see FIG. 10) in a figure G1 and the X-axis, as shown in FIG. 11. The angle θm is obtained as follows:

$$\theta m = \tan^{-1}((Ys-Ym)/(Xs-Xm)) \quad \text{(expression 6)}$$

If there is distortion (undulation) in the guide rail 33 actually, the straight line 520 in the head unit 220 and an X-axis line 600 intersect with each other at an angle θd, as shown in FIG. 10.

In this case, as shown in FIG. 11, the amount of displacement in the direction X of the center position coordinates of the main camera 223 in a figure G2 with respect to the figure G1 is Xdx(M)+Ydx(M), and the amount of displacement in the direction X of the center position coordinates of the auxiliary camera 224 in the figure G2 with respect to the figure G1 is Xdx(S)+Ydx(S). Furthermore, the amount of displacement in the direction Y of the center position coordinates of the main camera 223 in the figure G2 with respect to the figure G1 is Xdy(M)+Ydy(M), and the amount of displacement in the direction Y of the center position coordinates of the auxiliary camera 224 in the figure G2 with respect to the figure G1 is Xdy(S)+Ydy(S).

The amounts of displacement Xdy(M)+Ydy(M), Xdy(S)+Ydy(S), Xdx(M)+Ydx(M), and Xdx(S)+Ydx(S) are calculated on the basis of reference to correction tables previously prepared by a procedure similar to that of the first embodiment. In the case of the second embodiment, the auxiliary camera 224 is displaced by a prescribed distance (=L2−L1) along arrow Y1 with respect to the main camera 223, as shown in FIG. 10. Thus, Xdx(M)+Ydx(M) is included in the X-components of correction amounts in a correction table acquired with the main camera 223, and Xdy(M)+Ydy(M) is included in the Y-components of the correction amounts in the correction table acquired with the main camera 223. Similarly, Xdx(S)+Ydx(S) is included in the X-components of correction amounts in a correction table acquired with the auxiliary camera 224, and Xdy(S)+Ydy(S) is included in the Y-components of the correction amounts in the correction table acquired with the auxiliary camera 224. The correction tables acquired in the second embodiment are different in these points from the correction tables 5a and 5b (see FIG. 7) acquired in the first embodiment.

Therefore, the rotation angle θd in the figure G2 in the second embodiment is obtained on the basis of a correction table (not shown) acquired on the basis of the structure of the head unit 220 as follows:

$$\theta d = \tan^{-1}(((Ys+Xdy(S)+Ydy(S))-(Ym+Xdy(M)+Ydy(M)))/((Xs+Xdx(S)+Ydx(S))-(Xm+Xdx(M)+Ydx(M)))) \quad \text{(expression 7)}$$

Thus, the head unit 220 is displaced to the position of the figure G2 (drawn with solid lines) by rotating the figure G1 counterclockwise by a horizontal rotation angle θ (=θd−θm) in FIG. 11. Therefore, according to the second embodiment, the horizontal rotation angle θ is obtained by replacing θ with θd−θm. In this case, the amount of rotation-induced displacement Udx is calculated as follows:

$$Udx = (Xum \times \cos\theta - Yum \times \sin\theta) - Xum \quad \text{(expression 8)}$$

The amount of rotation-induced displacement Udy is calculated as follows:

$$Udy = (Xum \times \sin\theta + Yum \times \cos\theta) - Yum \quad \text{(expression 9)}$$

In other words, the amount of rotation-induced displacement Udx in the direction X of the center position of the suction nozzle 25 is calculated on the basis of the horizontal rotation angle θ, the relative position Xum in the direction X of the center position of the suction nozzle 25 with respect to the center position of the main camera 223, and the relative position Yum in the direction Y of the center position of the suction nozzle 25 with respect to the center position of the main camera 223 in the expression 8. The amount of rotation-induced displacement Udy in the direction Y of the center position of the suction nozzle 25 is also calculated on the basis of the horizontal rotation angle θ, the aforementioned relative position Xum in the direction X, and the aforementioned relative position Yum in the direction Y in the expression 9. In FIG. 11, the relative position Xum is Xum=Xu1−Xm, and the relative position Yum is Yum=Yu1−Ym.

According to the second embodiment, as hereinabove described, the amount of displacement in the direction X of the suction nozzle 25 induced by the displacement of the center position of the main camera 223 from the theoretical position coordinates (Xm, Ym) thereof is described as "Xdx+Ydx", and the amount of displacement in the direction Y of the suction nozzle 25 induced by the displacement of the center position of the main camera 223 from the theoretical position coordinates (Xm, Ym) thereof is described as "Xdy+Ydy". There is the positional relation of intersecting at the angle θm between the straight line 520 and the X-axis line 600 in the figure G1, whereby the component Ydx included in the amount of displacement Xdx+Ydx represents a component of the amount of displacement (amount of movement) in the direction X resulting from counterclockwise rotation about the main camera 223 by the angle θm from the state (see FIG. 5) of the figure G1 in the first embodiment. Furthermore, the component Ydy included in the amount of displacement Xdy+Ydy represents a component of the amount of displacement (amount of movement) in the direction Y resulting from the counterclockwise rotation about the main camera 223 by the angle θm from the state (see FIG. 5) of the figure G1 in the first embodiment. According to the second embodiment, the components Ydx and Ydy that are not zero are added in the amounts of displacement of the suction nozzle 25. The component Xdx of the amount of displacement Xdx+Ydx and the component Xdy of the amount of displacement Xdy+Ydy are examples of the "first component" in the present invention. The component Ydx of the amount of displacement Xdx+Ydx and the component Ydy of the amount of displacement Xdy+Ydy are examples of the "second component" in the present invention.

Therefore, according to the second embodiment, the amounts of movement (correction amounts) from the center position coordinates (Xu1, Yu1) of the suction nozzle 25 to coordinates (Xu2, Yu2) are calculated as follows:

$$Mv(dx) = Xdx + Ydx + Udx \quad \text{(expression 10)}$$

$$Mv(dy) = Xdy + Ydy + Udy \quad \text{(expression 11)}$$

In this manner, also according to the second embodiment, the central processing unit 71 derives the amounts of rotation-induced displacement Udx and Udy of the suction nozzle 25 from the expressions 8 and 9 on the basis of the machine coordinates of the main camera 223, the auxiliary camera 224, and the suction nozzle 25 (the center position coordinates (Xm, Ym) of the main camera 223, the center position coordinates (Xs, Ym) of the auxiliary camera 224, and the center position coordinates (Xu1, Yu1) of the suction nozzle 25) constituting the figure G1 and the result of calculation of the horizontal rotation angle θ (=θd−θm) regarding movement (rotational movement) from the figure G1 to the figure G2, and estimates the correction amounts (the amounts of movement Mv(dx) and Mv(dy)) of the center position of the suction nozzle 25 from the expressions 10 and 11 further using the amount of displacement Xdx+Ydx in the direction X and the amount of displacement Xdy+Ydy in the direction Y of the suction nozzle 25 based on the center position of the main camera 223, respectively. The remaining structure of the surface mounter 200 according to the second embodiment is similar to that of the surface mounter 100 according to the aforementioned first embodiment.

According to the second embodiment, as hereinabove described, the auxiliary camera 224 is arranged at a different position along arrow Y1 with respect to the main camera 223, the amount of displacement Xdx+Ydx of the suction nozzle 25 includes the component Ydx (≠0) based on the positional displacement of the auxiliary camera 224 along arrow Y1 with respect to the main camera 223 in addition to the component Xdx based on the displacement of the center position of the main camera 223 from the theoretical position coordinates (Xm, Ym) thereof, and the amount of displacement Xdy+Ydy of the suction nozzle 25 includes the component Ydy (≠0) based on the positional displacement of the auxiliary camera 224 along arrow Y1 with respect to the main camera 223 in addition to the component Xdy based on the displacement of the center position of the main camera 223 from the theoretical position coordinates (Xm, Ym) thereof. Furthermore, the central processing unit 71 is configured to perform control of correcting the center position of the suction nozzle 25 on the basis of the amounts of rotation-induced displacement Udx and Udy of the center of the suction nozzle 25, the horizontal rotation angle θ of the head unit 220 in a horizontal plane, the amount of displacement Xdx+Ydx that is not induced by the rotation, and the amount of displacement Xdy+Ydy that is not induced by the rotation. Thus, the central processing unit 71 can properly correct the center position of the suction nozzle 25 by taking the component Ydy based on the positional displacement in the direction Y into consideration when moving the head unit 220 even if the head unit 220 in which the auxiliary camera 224 is arranged at the different position along arrow Y1 with respect to the main camera 223 is used. Consequently, the suction nozzle 25 can be accurately moved to a mounting position on a printed board 1. The remaining effects of the second embodiment are similar to those of the aforementioned first embodiment.

(Third Embodiment)

A third embodiment is now described with reference to FIGS. 1, 4, and 12. In a surface mounter 300 (see FIG. 1) according to the third embodiment of the present invention, the center positions of suction nozzles 25 (see FIG. 4) are corrected on the basis of grasp (prediction) of the center position of a slide guide portion 21 (see FIG. 4) connecting a mounting head 22 (see FIG. 4) and a ball screw shaft 31 (see FIG. 4) dissimilarly to the control of correcting the displacement of a head unit 20 in the surface mounter 100 according to the first embodiment. In the drawings, portions identical to those of the aforementioned first embodiment are shown by the same reference numerals.

In operations performed by a central processing unit 71 according the third embodiment, information (X(K), Y(K)) of the center position of the slide guide portion 21 is incorporated into arithmetic processing. In other words, the center position (X(K), Y(K)) of the slide guide portion 21 rotationally displaced along with rotation of the center position of a main camera 23 is grasped (predicted), and the amounts of rotation-induced displacement Udx and Udy of the center position (Xu1, Yu1) of a suction nozzle 25 are calculated on the basis of the positional relation between the center position (Xu1, Yu1) of the suction nozzle 25 and the center position (X(K), Y(K)) of the slide guide portion 21 whose rotational displacement is considered (predicted). Then, arithmetic processing substantially similar to the arithmetic processing in the first embodiment using the amounts of parallel displacement (the amount of X-direction displacement Xdx and the amount of Y-direction displacement Xdy) of the suction nozzle 25 in a case of using the main camera 23 as a reference is applied to calculate the amount of movement Mv(dx) in a direction X of the center position of the suction nozzle 25 and the amount of movement Mv(dy) in a direction Y of the center position of the suction nozzle 25. A method for obtaining parameters used in the third embodiment is hereinafter described.

Figure 12:
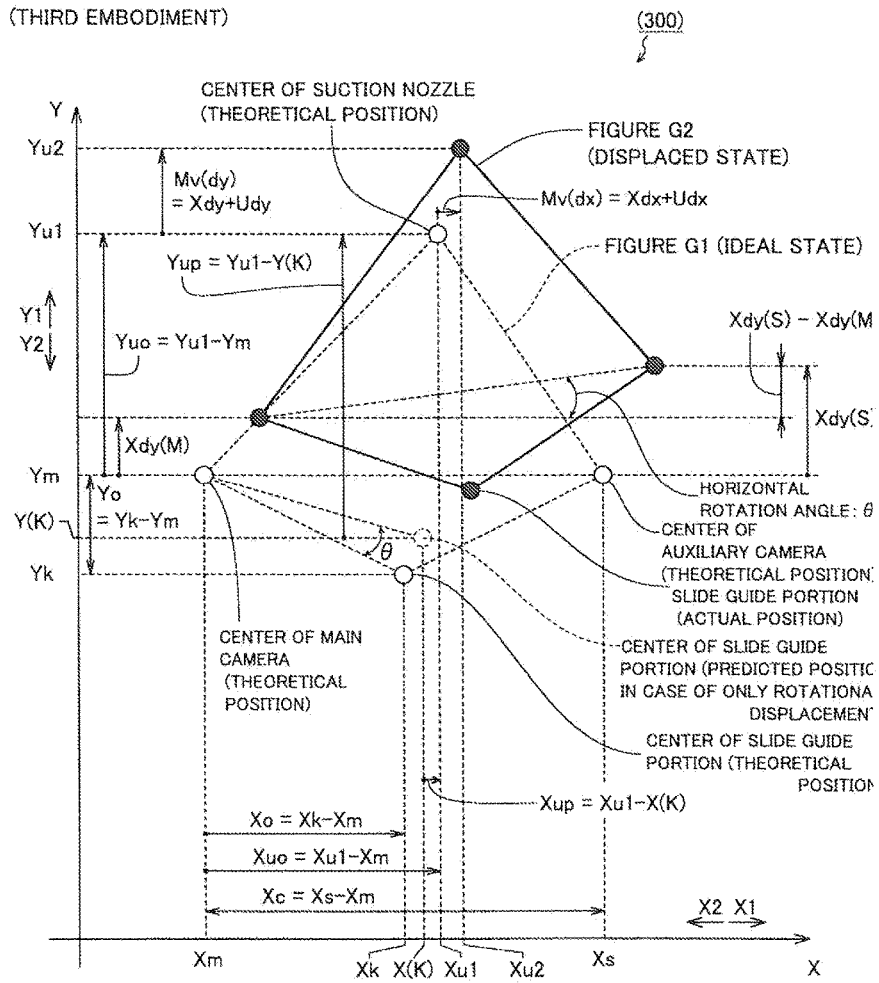
FIG. 12 illustrates a method for calculating the amounts of displacement (correction amounts) of a suction nozzle from the theoretical position coordinates thereof associated with the displacement of a head unit in a surface mounter according to a third embodiment of the present invention.

More specifically, the X-coordinate X(K) and the Y-coordinate Y(K) of the center position of the slide guide portion 21 rotationally displaced along with the rotation of the center position of the main camera 23 are predicted on the basis of the relative position Xo of the slide guide portion 21 in the direction X with respect to the main camera 23 (see FIG. 4) represented by Xo=Xk−Xm and the relative position Yo of the slide guide portion 21 in the direction Y with respect to the main camera 23 represented by Yo=Yk−Ym, as shown in FIG. 12.

More detailedly, the X-coordinate X(K) of the center position of the slide guide portion 21 induced by the rotation of the center position of the main camera 23 from the theoretical position coordinates (Xm, Ym) thereof is obtained with a horizontal rotation angle θ as follows:

$$X(K)=Xm+(Xo\times\cos\theta - Yo\times\sin\theta) \quad \text{(expression 12)}$$

The Y-coordinate Y(K) of the center position of the slide guide portion 21 induced by the rotation is obtained with the horizontal rotation angle θ as follows:

$$Y(K)=Ym+(Xo\times\sin\theta + Yo\times\cos\theta) \quad \text{(expression 13)}$$

In FIG. 12, the position (predicted position) of the slide guide portion 21 whose rotational displacement is considered is shown by a circle with a broken line. A method for calculating the horizontal rotation angle θ is similar to the method according to the aforementioned first embodiment.

As shown in FIG. 12, a distance between the X-coordinate X(K) of the slide guide portion 21 whose rotational displacement is considered and the X-coordinate Xu1 as the theoretical position of the suction nozzle 25 is represented by a relative position Xup=Xu1−X(K), and a distance between the Y-coordinate Y(K) of the slide guide portion 21 whose rotational displacement is considered and the Y-coordinate Yu1 as the theoretical position of the suction nozzle 25 is represented by a relative position Yup=Yu1−Y(K). Therefore, the amounts of rotation-induced displacement Udx and Udy of the center position of the suction nozzle 25 induced by the horizontal rotation angle θ in a case of considering the positional relation between the main camera 23 and the slide guide portion 21 are obtained as described below.

In other words, the amount of rotation-induced displacement Udx in the third embodiment is calculated as follows:

$$Udx=(Xup \times \cos\theta - Yup \times \sin\theta) - Xup \quad \text{(expression 14)}$$

The amount of rotation-induced displacement Udy is calculated as follows:

$$Udy=(Xup \times \sin\theta + Yup \times \cos\theta) - Yup \quad \text{(expression 15)}$$

In other words, according to the third embodiment, the amount of rotation-induced displacement Udx in the direction X of the center position of the suction nozzle 25 is calculated on the basis of the horizontal rotation angle θ, the relative position Xup of the center position of the suction nozzle 25 in the direction X with respect to the center position of the slide guide portion 21 whose rotational displacement is considered, and the relative position Yup of the center position of the suction nozzle 25 in the direction Y with respect to the center position of the slide guide portion 21 whose rotational displacement is considered in the expression 14. The amount of rotation-induced displacement Udy in the direction Y of the center position of the suction nozzle 25 is also calculated on the basis of the horizontal rotation angle θ, the relative position Xup of the center position of the suction nozzle 25 in the direction X with respect to the center position of the slide guide portion 21 whose rotational displacement is considered, and the relative position Yup of the center position of the suction nozzle 25 in the direction Y with respect to the center position of the slide guide portion 21 whose rotational displacement is considered in the expression 15.

Then, the correction amounts (the amount of movement Mv(dx)=Xdx+Ydx+Udx (where Ydx=0) and the amount of movement Mv(dy)=Xdy+Ydy+Udy (where Ydy=0)) of the center position of the suction nozzle 25 are calculated with the amount of X-direction displacement Xdx (the amount of X-direction displacement at a position corresponding to the X-coordinate (Xu1) of the suction nozzle 25 in a correction table 5a (see FIG. 7) regarding the main camera 23) of the suction nozzle 25 induced by the displacement of the center position of the main camera 23 from the theoretical position coordinates (Xm, Ym) thereof, the amount of Y-direction displacement Xdy (the amount of Y-direction displacement at a position corresponding to the Y-coordinate (Yu1) of the suction nozzle 25 in the correction table 5a regarding the main camera 23) of the suction nozzle 25 induced by the displacement of the center position of the main camera 23 from the theoretical position coordinates (Xm, Ym) thereof, the amount of rotation-induced displacement Udx calculated from the expression 14, and the amount of rotation-induced displacement Udy calculated from the expression 15.

In this manner, according to the third embodiment, the central processing unit 71 estimates the correction amounts (the amounts of movement Mv(dx) and Mv(dy)) of the center position of the suction nozzle 25 on the basis of the machine coordinates of the main camera 23, the slide guide portion 21, an auxiliary camera 24, and the suction nozzle 25 constituting a figure G1, the result of calculation of the horizontal rotation angle θ regarding movement (rotational movement) from the figure G1 to a figure G2, the predicted values of the center position coordinates (X(K), Y(K)) of the slide guide portion 21 rotationally displaced along with the rotation of the center position of the main camera 23, and the amounts of rotation-induced displacement Udx and Udy of the suction nozzle 25 calculated on the basis of these predicted values and the theoretical position coordinates (Xu1, Yu1) of the suction nozzle 25. The remaining structure of the surface mounter 300 according to the third embodiment is similar to that of the surface mounter 100 according to the aforementioned first embodiment.

According to the third embodiment, as hereinabove described, the central processing unit 71 is configured to grasp (predict) the center position (X(K), Y(K)) of the slide guide portion 21 rotationally displaced along with the rotation of the center position (Xm, Ym) of the main camera 23 on the basis of the horizontal rotation angle θ and the positional relation between the slide guide portion 21 and the main camera 23, and calculate the amounts of rotation-induced displacement Udx and Udy on the basis of the horizontal rotation angle θ, the relative position Xup in the direction X from the grasped center position (X(K), Y(K)) of the slide guide portion 21 to the center position (Xu1, Yu1) of the suction nozzle 25, and the relative position Yup in the direction Y from the grasped center position (X(K), Y(K)) of the slide guide portion 21 to the center position (Xu1, Yu1) of the suction nozzle 25. Furthermore, the central processing unit 71 is configured to perform control of correcting the center position of the suction nozzle 25 on the basis of the amount of movement Mv(dx) of the suction nozzle 25 calculated on the basis of the amount of rotation-induced displacement Udx and the amount of X-direction displacement Xdx that is not induced by the rotation and the amount of movement Mv(dy) of the suction nozzle 25 calculated on the basis of the amount of rotation-induced displacement Udy and the amount of Y-direction displacement Xdy that is not induced by the rotation. Thus, the center position of the suction nozzle 25 based on the displacement of the center position of the main camera 23 can be corrected also by taking the positional information (X(K), Y(K)) regarding the rotational displacement of the slide guide portion 21 lying between the main camera 23 and the suction nozzle 25 into consideration in the arithmetic processing in addition to a case of correcting the center position of the suction nozzle 25 on the basis of only the relation between the center position of the main camera 23 and the center position of the suction nozzle 25 as in the first embodiment. In other words, the center position (X(K), Y(K)) regarding the rotational displacement of the slide guide portion 21 actually moving the head unit 20 on the basis of the horizontal rotation angle θ is first grasped (predicted), and then the amounts of rotation-induced displacement Udx and Udy of the center position of the suction nozzle 25 induced by the grasped rotational displacement of the center position of the slide guide portion 21 is derived, whereby the final correction amounts (the amounts of movement Mv(dx) and Mv(dy)) of the center position of the suction nozzle 25 can be calculated. Thus, the suction nozzle 25 can be accurately moved to a mounting position on a printed board 1 also by the aforementioned method. The remaining effects of the third embodiment are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are included.

For example, while the present invention is applied to the surface mounter in each of the aforementioned first to third embodiments, the present invention is not restricted to this. For example, the present invention may alternatively be applied to a dispenser that applies an applying agent such as a solder paste or an adhesive to fix the electronic component to a prescribed applying position on the board, as the example of the "working apparatus for a component or a board" according to the present invention. In other words, this dispenser can perform control of moving a dispenser head (head unit) while correcting the center position of a discharge nozzle on the basis of the rotation angle of the dispenser head in a horizontal plane, the amounts of rotation-induced displacement of the center of the discharge nozzle due to the rotation angle, and the first amount of displacement in the first direction and the second amount of displacement in the second direction that are not induced by the rotation of the center of the discharge nozzle. Furthermore, the present invention may alternatively be applied to a component testing apparatus that conveys an electronic component suctioned by a suction nozzle to a testing socket arranged at a prescribed position and tests the performance of the electronic component by connecting the electronic component to the testing socket, as the example of the "working apparatus for a component or a board" according to the present invention.

While the present invention is applied when the head unit 20 in which the plurality of (six) suction nozzles 25 are aligned in line in the X-axis direction is moved in each of the aforementioned first to third embodiments, the present invention is not restricted to this. For example, the present invention may alternatively be applied when a rotary head unit including the plurality of suction nozzles 25 annularly arranged on the lower surface side of the mounting head 22 is moved. In the rotary head unit, the annularly arranged suction nozzles 25 are circularly moved in the horizontal direction on the lower surface side of the mounting head 22, whereby the working position of each of the suction nozzles 25 is changed. Also in this case, the positional relation between the main camera 23 or the auxiliary camera 24 and each of the suction nozzles 25 is known, and hence the present invention can be easily applied.

While the present invention is applied to the control of moving the head unit 20 in which each of the suction nozzles 25 is arranged at the position displaced by the distance L3 along arrow Y1 from the straight line 500 in a region between the main camera 23 and the auxiliary camera 24 as viewed along the direction Z in each of the aforementioned first and third embodiments, the present invention is not restricted to this. For example, the present invention may alternatively be applied to control of moving a head unit in which the suction nozzles 25 are arranged in a region on the side of the auxiliary camera 24 opposite to the main camera 23 (along arrow X1).

While the center position of the suction nozzle 25 is corrected on the basis of the horizontal rotation angle θ of the head unit 20 (220), the amount of X-direction displacement Xdx (Xdx+Ydx in the second embodiment) of the suction nozzle 25 induced by the displacement of the center position of the main camera 23 (223) from the theoretical position coordinates (Xm, Ym) thereof, and the amount of Y-direction displacement Xdy (Xdy+Ydy in the second embodiment) of the suction nozzle 25 induced by the displacement of the center position of the main camera 23 (223) from the theoretical position coordinates (Xm, Ym) thereof in each of the aforementioned first to third embodiments, the present invention is not restricted to this. The center position of the suction nozzle 25 may alternatively be corrected on the basis of the horizontal rotation angle θ and the amounts of displacement of the suction nozzle 25 induced by the displacement of the center position of the auxiliary camera 24 (224) from the theoretical position coordinates (Xs, Ys) thereof, for example.

While the horizontal rotation angle θ is calculated with the expression 3 in each of the aforementioned first and third embodiments, the present invention is not restricted to this. When the horizontal rotation angle θ is small in the expression 3, for example, an approximate expression sine θ≈tan θ is satisfied. Thus, a calculation processing program may be configured as $\theta = \tan^{-1}((Xdy(S)-Xdy(M))/(Xs-Xm))$ . . . (expression 3a) when the horizontal rotation angle θ is obtained.

While the correction tables 5a and 5b are prepared by measuring the correction amounts (ΔX, ΔY) with respect to only the reference marks R in the L-shaped area 106 surrounded by a broken line on the jig plate 105 in each of the aforementioned first to third embodiments, the present invention is not restricted to this. In other words, correction tables may alternatively be prepared by measuring the correction amounts (ΔX, ΔY) with respect to all the reference marks R (P×Q in total) if the storage capacity of the correction data storage portion 72b is sufficiently ensured.

What is claimed is:

1. A working apparatus for a component or a board, comprising:
    a head unit including a first imaging portion, a second imaging portion, and a working mechanism portion only arranged at one side region against a straight line passing through a center of the first imaging portion and a center of the second imaging portion in a plan view, wherein, theoretical position coordinates of a center position of the working mechanism portion are located at a first fixed distance in an X-axis direction and a second fixed distance in a Y-axis direction away from theoretical position coordinates of a center position of the first imaging portion, and wherein the X-axis direction and a Y-axis direction are orthogonal to each other in a horizontal plane;
    a control portion performing control of moving the head unit along the X-axis direction and the Y-axis direction; and
    a correction table to which the control portion refers for an amount of displacement of actual position coordinates of the center of the first imaging portion with respect to theoretical position coordinates of the center of the first imaging portion and an amount of displacement of actual position coordinates of the center of the second imaging portion with respect to theoretical position coordinates of the center of the second imaging portion when moving the head unit in the horizontal plane, wherein
    with respect to a straight line passing through the center of the first imaging portion and the center of the second imaging portion in a plan view, the working mechanism portion is only arranged at the one side region, and both an optical axis of the first imaging portion and an optical axis of the second imaging portion are arranged along a Z-axis direction orthogonal to the X-axis direction and the Y-axis direction,
    the first imaging portion and the second imaging portion are configured to acquire respective displacement of the center of the first imaging portion and the second imaging portion with respect to theoretical position coordinates of the center position of the first imaging portion and the second imaging portion, when the head unit moves in the horizontal plane,
    the control portion is configured to perform control of:
        calculating a rotation angle in the horizontal plane of the head unit from displacement of the center of the first imaging portion and displacement of the center of the second imaging portion, and correcting the center position of the working mechanism portion on the basis of an amount of rotation-induced displacement of a center of the working mechanism portion due to the rotation angle, a first amount of displacement of the center of the working mechanism portion in the X-axis direction being induced by parallel movement of the head unit, and a second amount of displacement of the center of the working mechanism portion in the Y-axis direction being induced by parallel movement of the head unit when moving the head unit, wherein the amount of rotation-induced displacement includes a first amount of rotation-induced displacement being an X-axis direction component of the amount of rotation-induced displacement and a second amount of rotation-induced displacement being a Y-axis direction component of the amount of rotation-induced displacement which are calculated on the basis of the rotation angle, the first fixed distance, and the second fixed distance relatively, the control portion is configured to acquire the displacement of the center of the first imaging portion, the displacement of the center of the second imaging portion, the first amount of displacement, and the second amount of displacement on the basis of the correction table, and the control portion is configured to perform control of correcting the center position of the working mechanism portion on the basis of:

a first correction amount in the X-axis direction of the center position of the working mechanism portion based on the first amount of rotation-induced displacement and the first amount of displacement and a second correction amount in the Y-axis direction of the center position of the working mechanism portion based on the second amount of rotation-induced displacement and the second amount of displacement.

2. The working apparatus for a component or a board according to claim 1, wherein
the control portion is configured to perform control of correcting the center position of the working mechanism portion and moving the head unit on the basis of the rotation angle in the horizontal plane of the head unit, the amount of rotation-induced displacement, the first amount of displacement, and the second amount of displacement, each time a single operation on the individual component or the individual board is performed.

3. The working apparatus for a component or a board according to claim 1, wherein
the control portion is configured to perform arithmetic processing for correcting the center position of the working mechanism portion and perform control of moving the head unit on the basis of the rotation angle in the horizontal plane of the head unit, the amount of rotation-induced displacement, the first amount of displacement, and the second amount of displacement.

4. The working apparatus for a component or a board according to claim 1, wherein
the first correction amount is a sum of the first amount of rotation-induced displacement and the first amount of displacement, and
the second correction amount is a sum of the second amount of rotation-induced displacement and the second amount of displacement.

5. The working apparatus for a component or a board according to claim 1, wherein
the control portion is configured to perform control of moving the center position of the working mechanism portion to position coordinates obtained by subtracting the first correction amount in the X-axis direction and the second correction amount in the Y-axis direction from the theoretical position coordinates of the center position of the working mechanism portion, respectively, when moving the head unit.

6. The working apparatus for a component or a board according to claim 1, wherein
the control portion is configured to perform control of calculating the rotation angle in the horizontal plane of the head unit from the displacement of the center of the first imaging portion and the displacement of the center of the second imaging portion grasped on the basis of the correction table and correcting the center position of the working mechanism portion on the basis of the amount of rotation-induced displacement of the center of the working mechanism portion due to the rotation angle, the first amount of displacement, and the second amount of displacement when moving the head unit.

7. The working apparatus for a component or a board according to claim 6, wherein
the correction table includes a first correction table in which the amount of displacement of the actual position coordinates of the center of the first imaging portion with respect to the theoretical position coordinates of the center of the first imaging portion is defined and a second correction table in which the amount of displacement of the actual position coordinates of the center of the second imaging portion with respect to the theoretical position coordinates of the center of the second imaging portion is defined, and
the amount of rotation-induced displacement is calculated with the first correction table and the second correction table while the first amount of displacement and the second amount of displacement are calculated with the first correction table or the second correction table.

8. The working apparatus for a component or a board according to claim 1, further comprising a moving mechanism portion so configured that the head unit is movable in the horizontal plane, wherein
the control portion is configured to perform control of calculating the rotation angle in the horizontal plane of the head unit from the displacement of the center of the first imaging portion and the displacement of the center of the second imaging portion resulting from distortion of the moving mechanism portion and correcting the center position of the working mechanism portion on the basis of the amount of rotation-induced displacement of the center of the working mechanism portion due to the rotation angle, the first amount of displacement, and the second amount of displacement when moving the head unit by the moving mechanism portion.

9. The working apparatus for a component or a board according to claim 8, wherein
the moving mechanism portion includes a rail member extending in the X-axis direction to move the head unit along the X-axis direction, and
the control portion is configured to perform control of calculating the rotation angle in the horizontal plane of the head unit from the displacement of the center of the first imaging portion and the displacement of the center of the second imaging portion resulting from deformation of the rail member in the Y-axis direction and correcting the center position of the working mechanism portion on the basis of the amount of rotation-induced displacement of the center of the working mechanism portion due to the rotation angle, the first amount of displacement, and the second amount of displacement when moving the head unit.

10. The working apparatus for a component or a board according to claim 1, wherein
a plurality of the working mechanism portions are provided on the head unit, and
the control portion is configured to perform control of calculating the rotation angle in the horizontal plane of the head unit from the displacement of the center of the first imaging portion and the displacement of the center of the second imaging portion for each of the plurality of working mechanism portions and individually correcting each of center positions of the working mechanism portions on the basis of the amount of rotation-induced displacement of each of centers of the working mechanism portions due to the rotation angle, the first amount of displacement, and the second amount of displacement when moving the head unit.

11. The working apparatus for a component or a board according to claim 1, wherein
the head unit is configured to be movable along the X-axis direction,
the first imaging portion and the second imaging portion are arranged at positions aligned in the X-axis direction,
the first amount of displacement and the second amount of displacement of the working mechanism portion each include a first component based on displacement of a center position of the first imaging portion or the second imaging portion from theoretical position coordinates of the center position of the first imaging portion or the second imaging portion, and
the control portion is configured to perform control of correcting the center position of the working mechanism portion on the basis of:
the amount of rotation-induced displacement of the center of the working mechanism portion,
the rotation angle in the horizontal plane of the head unit,
the first amount of displacement including the first component, and
the second amount of displacement including the first component.

12. The working apparatus for a component or a board according to claim 1, wherein
the head unit is configured to be movable along the X-axis direction,
the second imaging portion is arranged at a different position in the Y-axis direction with respect to the first imaging portion,
the first amount of displacement and the second amount of displacement of the working mechanism portion each include a second component based on positional displacement of the second imaging portion along the Y-axis direction with respect to the first imaging portion in addition to a first component based on the displacement of the center position of the first imaging portion or the second imaging portion from the theoretical position coordinates of the center position of the first imaging portion or the second imaging portion, and
the control portion is configured to perform control of correcting the center position of the working mechanism portion on the basis of:
the amount of rotation-induced displacement of the center of the working mechanism portion,
the rotation angle in the horizontal plane of the head unit,
the first amount of displacement including the first and second components, and
the second amount of displacement including the first and second components.

13. The working apparatus for a component or a board according to claim 1, wherein
the head unit further includes a slide guide portion provided to be movable along the X-axis direction and guiding movement of the head unit in the X-axis direction,
a center position of the slide guide portion is grasped on the basis of the rotation angle and positional relation between the slide guide portion and the first imaging portion or the second imaging portion, and the amount of rotation-induced displacement is calculated on the basis of the rotation angle and positional relation between the grasped center position of the slide guide portion and the center position of the working mechanism portion, and
the control portion is configured to perform control of correcting the center position of the working mechanism portion on the basis of the amount of rotation-induced displacement, the first amount of displacement, and the second amount of displacement.

14. A component mounting apparatus comprising:
a head unit including a first imaging portion, a second imaging portion, and a suction nozzle only arranged at one side region against a straight line passing through a center of the first imaging portion and a center of the second imaging portion in a plan view, wherein, theoretical position coordinates of a center position of the suction nozzle are located at a first fixed distance in an X-axis direction and a second fixed distance in a Y-axis direction away from theoretical position coordinates of a center position of the first imaging portion, and wherein the X-axis direction and a Y-axis direction are orthogonal to each other in a horizontal plane;
a control portion performing control of moving the head unit along the X-axis direction and the Y-axis direction; and
a correction table to which the control portion refers for an amount of displacement of actual position coordinates of the center of the first imaging portion with respect to theoretical position coordinates of the center of the first imaging portion and an amount of displacement of actual position coordinates of the center of the second imaging portion with respect to theoretical position coordinates of the center of the second imaging portion when moving the head unit in the horizontal plane, wherein
with respect to a straight line passing through the center of the first imaging portion and the center of the second imaging portion in a plan view, the working mechanism portion is only arranged at the one side region, and both an optical axis of the first imaging portion and an optical axis of the second imaging portion are arranged along a Z-axis direction orthogonal to the X-axis direction and the Y-axis direction,
the first imaging portion and the second imaging portion are configured to acquire respective displacement of the center of the first imaging portion and the second imaging portion with respect to theoretical position coordinates of the center position of the first imaging portion and the second imaging portion, when the head unit moves in the horizontal plane, the control portion is configured to perform control of:
  calculating a rotation angle in the horizontal plane of the head unit from displacement of the center of the first imaging portion and displacement of the center of the second imaging portion, and
  correcting the center position of the suction nozzle on the basis of an amount of rotation-induced displacement of a center of the suction nozzle due to the rotation angle, a first amount of displacement of the center of the suction nozzle in the X-axis direction being induced by parallel movement of the head unit, and a second amount of displacement of the center of the suction nozzle in the Y-axis direction being induced by parallel movement of the head unit when moving the head unit,
  wherein the amount of rotation-induced displacement includes a first amount of rotation-induced displacement being an X-axis direction component of the amount of rotation-induced displacement and a second amount of rotation-induced displacement being a Y-axis direction component of the amount of rotation-induced displacement which are calculated on the basis of the rotation angle, the first fixed distance, and the second fixed distance relatively, the control portion is configured to acquire the displacement of the center of the first imaging portion, the displacement of the center of the second imaging portion, the first amount of displacement, and the second amount of displacement on the basis of the correction table, and the control portion is configured to perform control of correcting the center position of the suction nozzle on the basis of:
  a first correction amount in the X-axis direction of the center position of the suction nozzle based on the first amount of rotation-induced displacement and the first amount of displacement and
  a second correction amount in the Y-axis direction of the center position of the suction nozzle based on the second amount of rotation-induced displacement and the second amount of displacement.

15. The component mounting apparatus according to claim 14, wherein the head unit is configured to be movable along the X-axis direction, the second imaging portion is arranged at a different position in the Y-axis direction with respect to the first imaging portion, the first amount of displacement and the second amount of displacement of the suction nozzle each include a second component based on positional displacement of the second imaging portion along the Y-axis direction with respect to the first imaging portion in addition to a first component based on the displacement of the center position of the first imaging portion or the second imaging portion from the theoretical position coordinates of the center position of the first imaging portion or the second imaging portion, and the control portion is configured to perform control of correcting the center position of the suction nozzle on the basis of:
  the amount of rotation-induced displacement of the center of the suction nozzle,
  the rotation angle in the horizontal plane of the head unit,
  the first amount of displacement including the first and second components, and
  the second amount of displacement including the first and second components.

16. The component mounting apparatus according to claim 14, wherein the head unit further includes a slide guide portion provided to be movable along the X-axis direction and guiding movement of the head unit in the X-axis direction, a center position of the slide guide portion is grasped on the basis of the rotation angle and positional relation between the slide guide portion and the first imaging portion or the second imaging portion, and the amount of rotation-induced displacement is calculated on the basis of the rotation angle and positional relation between the grasped center position of the slide guide portion and the center position of the suction nozzle, and the control portion is configured to perform control of correcting the center position of the suction nozzle on the basis of the amount of rotation-induced displacement, the first amount of displacement, and the second amount of displacement.

* * * * *